US010581269B2

(12) United States Patent
Valin

(10) Patent No.: US 10,581,269 B2
(45) Date of Patent: Mar. 3, 2020

(54) ALTERNATIVE ENERGY BOOSTER APPARATUS

(71) Applicant: Yonca Valin, Winnemucca, NV (US)

(72) Inventor: Yonca Valin, Winnemucca, NV (US)

( * ) Notice: Subject to any disclaimer, the term of this patent is extended or adjusted under 35 U.S.C. 154(b) by 162 days.

(21) Appl. No.: 15/721,849

(22) Filed: Sep. 30, 2017

(65) Prior Publication Data
US 2018/0131229 A1  May 10, 2018

Related U.S. Application Data

(60) Provisional application No. 62/419,848, filed on Nov. 9, 2016.

(51) Int. Cl.
*H02J 9/06* (2006.01)
*H02J 7/35* (2006.01)
(Continued)

(52) U.S. Cl.
CPC .............. *H02J 9/061* (2013.01); *H01G 11/32* (2013.01); *H01M 4/366* (2013.01); *H01M 4/62* (2013.01); *H01M 10/0565* (2013.01); *H01M 10/425* (2013.01); *H01M 10/4264* (2013.01); *H01M 10/465* (2013.01); *H02J 1/10* (2013.01); *H02J 7/0068* (2013.01); *H02J 7/35* (2013.01); *H02J 9/062* (2013.01); *H02J 50/30* (2016.02); *H05K 5/06* (2013.01); *H05K 9/0007* (2013.01);
(Continued)

(58) Field of Classification Search
CPC .... H02J 9/061; H02J 1/10; H02J 9/062; H02J 2001/004; H02J 7/35; H02J 7/0068; H02J 50/30; H01M 4/366; H01M 2010/4271; H01M 2220/10; H01M 10/0565; H01M 10/425; H01M 10/465; H01M 4/62; H01M 10/4264; H05K 5/06; H05K 9/0007; H01G 11/32; H01G 11/10; Y02B 90/14; Y02B 10/72
See application file for complete search history.

(56) References Cited

U.S. PATENT DOCUMENTS 6,103,411 A * 8/2000 Matsubayashi ........... C01B 3/36
429/413
9,564,767 B2 * 2/2017 Takahashi ............... H02J 7/007
(Continued)

*Primary Examiner* — Michael C Zarroli

(57) ABSTRACT

What is disclosed here is an alternative energy booster apparatus that increases the performance and electricity generation that can be added to alternative energy systems, that includes enhanced energy generation utilizing layered materials, thermal materials, infrared, multiple power cells generation, light transferal of energy, and manufacturing to enhance electricity generation, storage, security, with embedded EMP protection of the apparatus that increases reliability, restorability and sustainability of the apparatus. The apparatus additionally utilizes mechanical, chemical, and computer controlled switching components to increase the electric voltage and current being generated, stored, and distributed managed by a computer controller. The apparatus also provides self contained security protected by a block chain recorded payment switching component as well as utilizing application of and additive printing manufacturing materials that are conductive and non conductive components for assembly of electrodes, cathodes, anodes and electrolyte in the apparatus.

20 Claims, 32 Drawing Sheets

Switching System for Shutoff of Cells, Modifying Polarity and Changing Circuit from Parallel to Series Connection Fig.1E. Programmable Controller
Fig.1A. Switch Between a plurality of Storage Devices Super capacitor, Ultra capacitor or batteries Connection of Cells
Fig.1B. Switch to Series or Parallel Connection of Cells
Fig.1C. Switch Polarity + - Connection of Cells
Fig.1D. Switch Off Override for each cell in Connection of Cells
DC Electronic Mechanical Switch, Electrode Dipper or Electrolyte Pump

(51) Int. Cl.
*H02J 50/30* (2016.01)
*H01M 4/62* (2006.01)
*H01M 10/46* (2006.01)
*H01M 10/42* (2006.01)
*H01M 10/0565* (2010.01)
*H02J 7/00* (2006.01)
*H01G 11/32* (2013.01)
*H05K 9/00* (2006.01)
*H05K 5/06* (2006.01)
*H01M 4/36* (2006.01)
*H02J 1/10* (2006.01)
*H01G 11/10* (2013.01)
*H02J 1/00* (2006.01)
*H01G 11/08* (2013.01)
*H01G 11/36* (2013.01)

(52) U.S. Cl.
CPC .............. *H01G 11/08* (2013.01); *H01G 11/10* (2013.01); *H01G 11/36* (2013.01); *H01M 2010/4271* (2013.01); *H01M 2220/10* (2013.01); *H02J 2001/004* (2013.01); *Y02B 10/72* (2013.01); *Y02B 90/14* (2013.01)

(56) References Cited

U.S. PATENT DOCUMENTS

| | | | |
|---|---|---|---|
| 9,570,753 B2* | 2/2017 | Dennis | H02J 1/10 |
| 10,305,295 B2* | 5/2019 | Kelly-Morgan | H02J 7/0026 |
| 2010/0060231 A1* | 3/2010 | Trainor | H01G 11/14 |
| | | | 320/103 |
| 2016/0146895 A1* | 5/2016 | Yazami | B60L 58/34 |
| | | | 324/426 |
| 2017/0236648 A1* | 8/2017 | Lazarev | H01G 4/14 |
| | | | 320/166 |

* cited by examiner

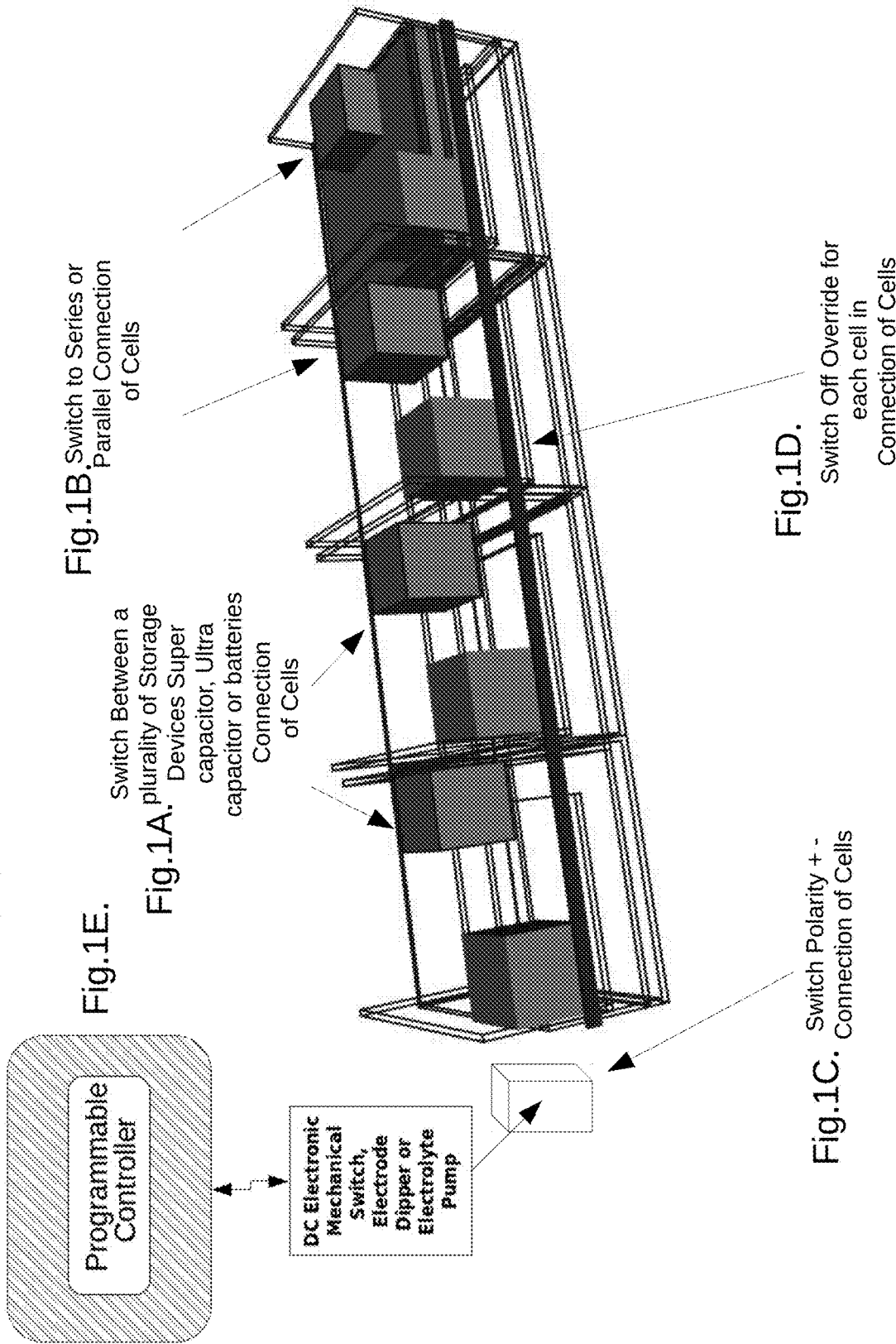

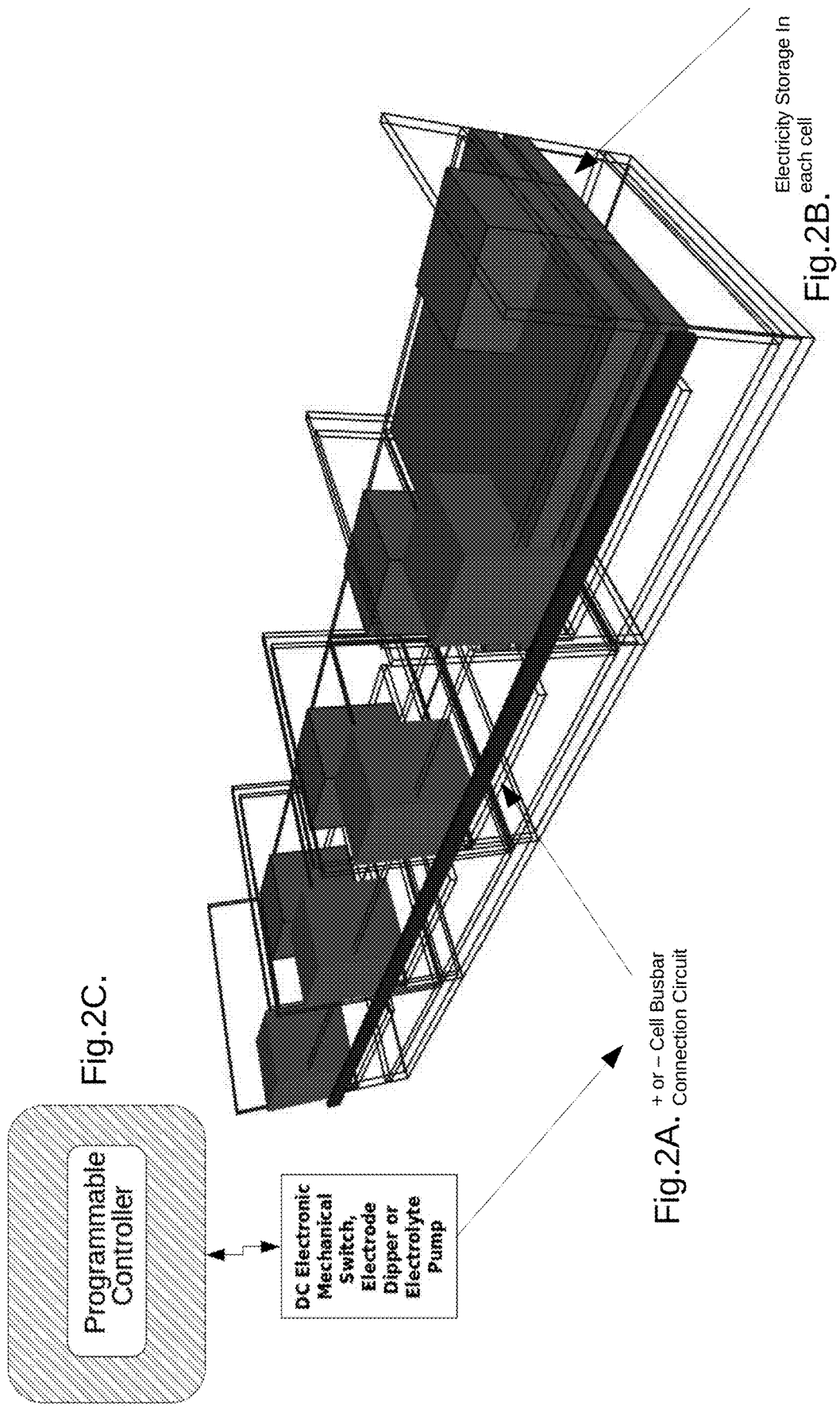
Fig. 2 Electricity Generation and Energy Storage Capacitor Area

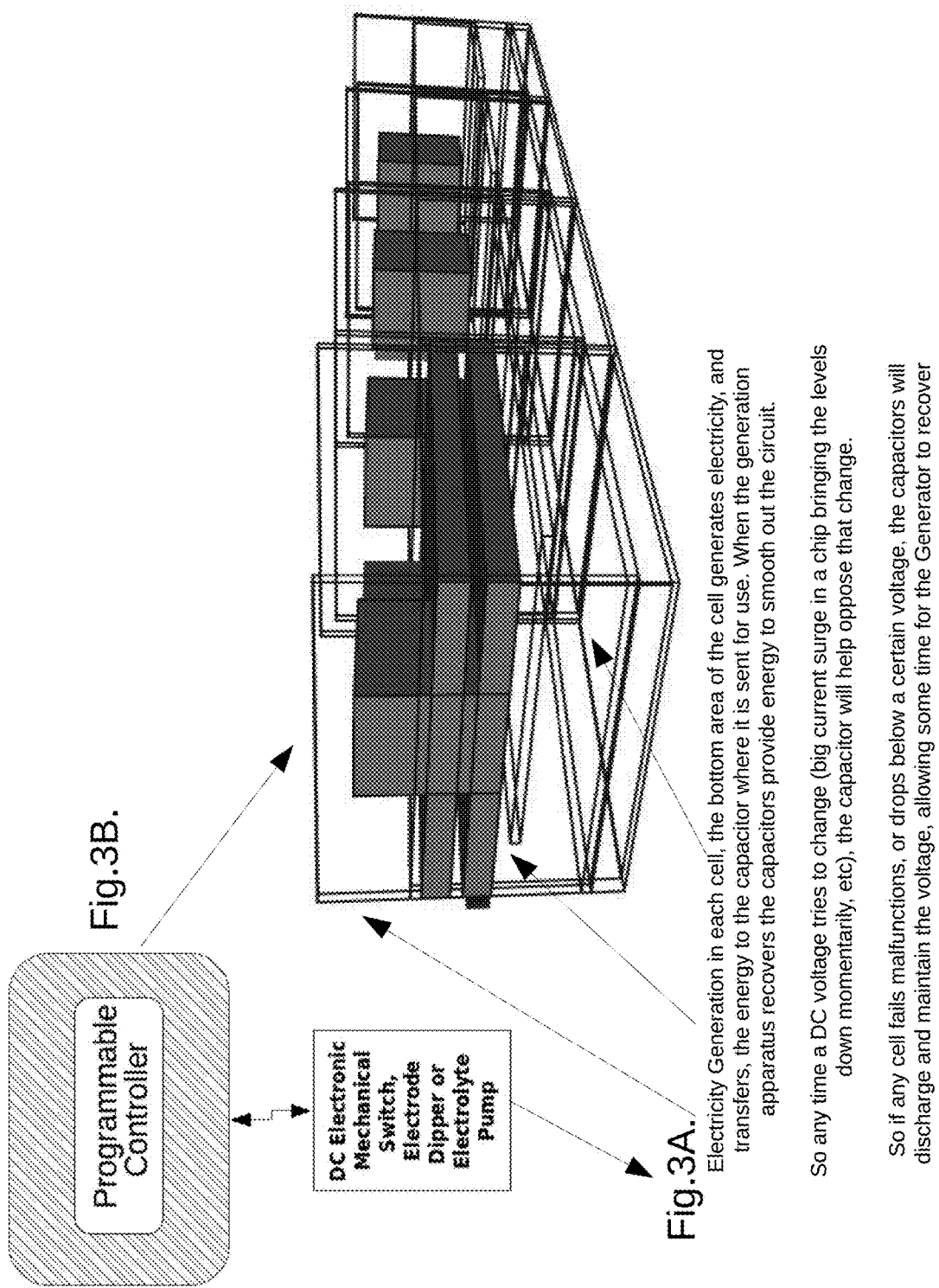

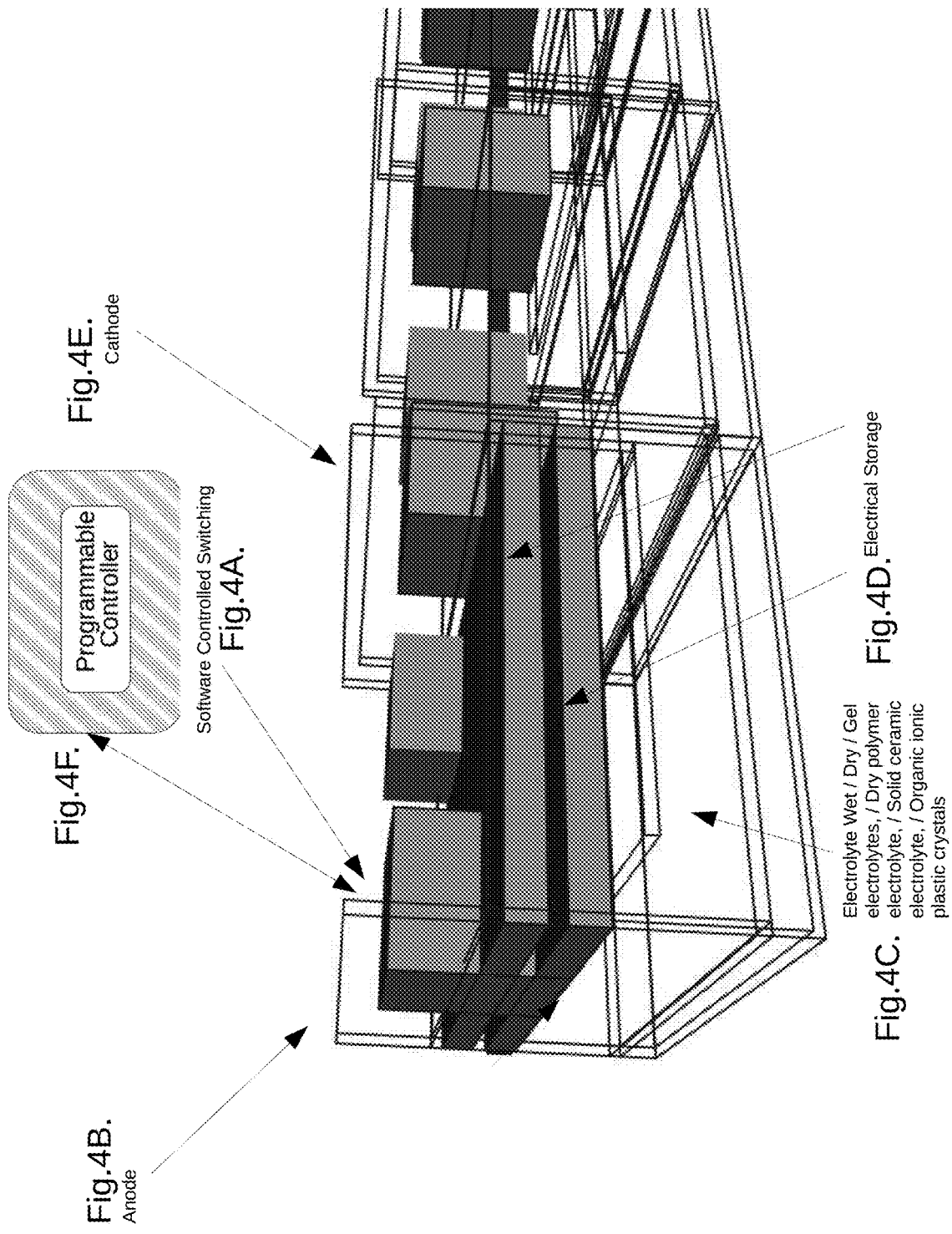
Fig. 4 Switching System for Shutoff of Cells and Modifying Polarity

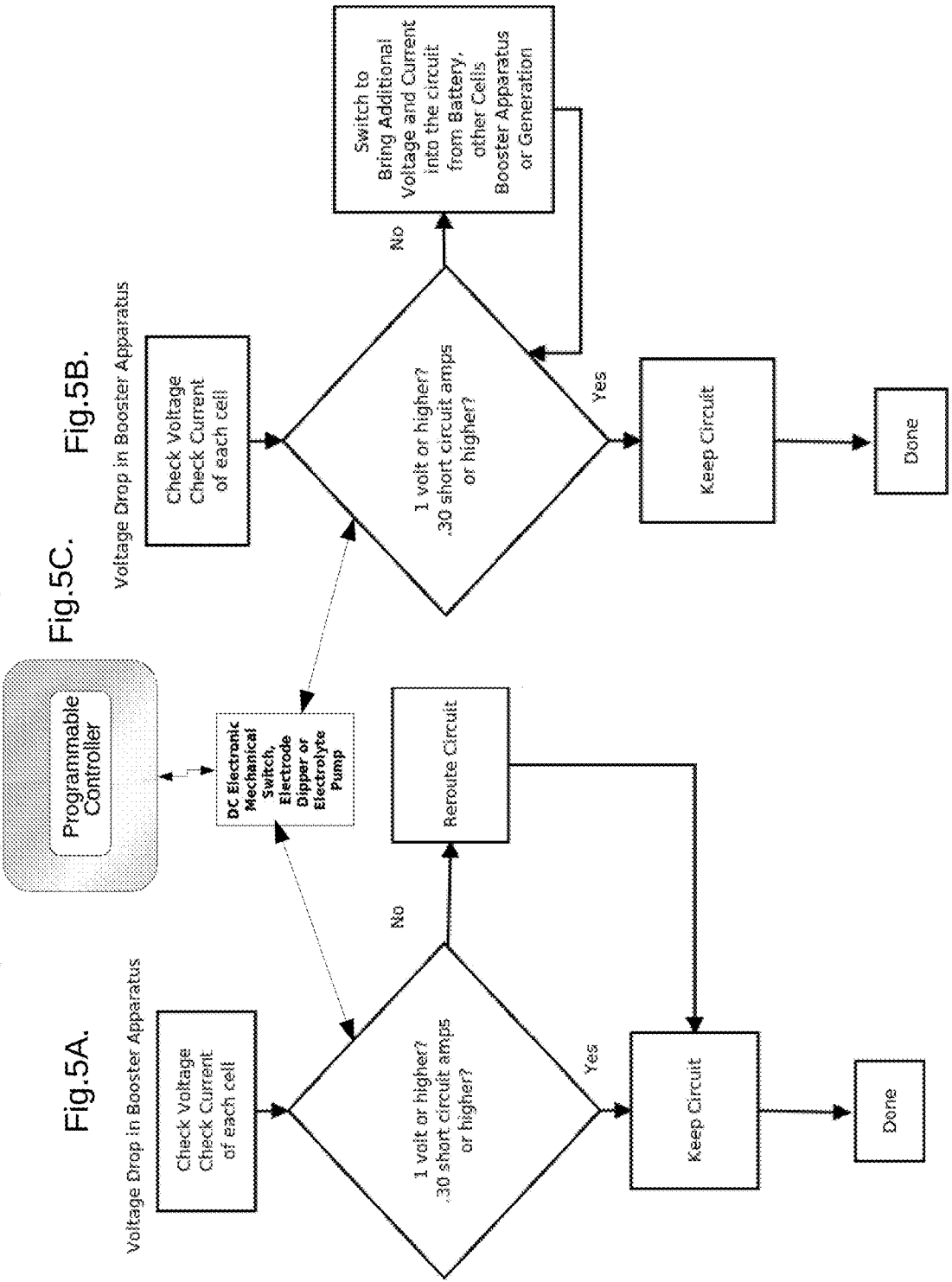
Fig. 5 Switching System Flow for Shutoff of Cells Rerouting and/or Switching to bring additional Voltage and Current into the Circuit

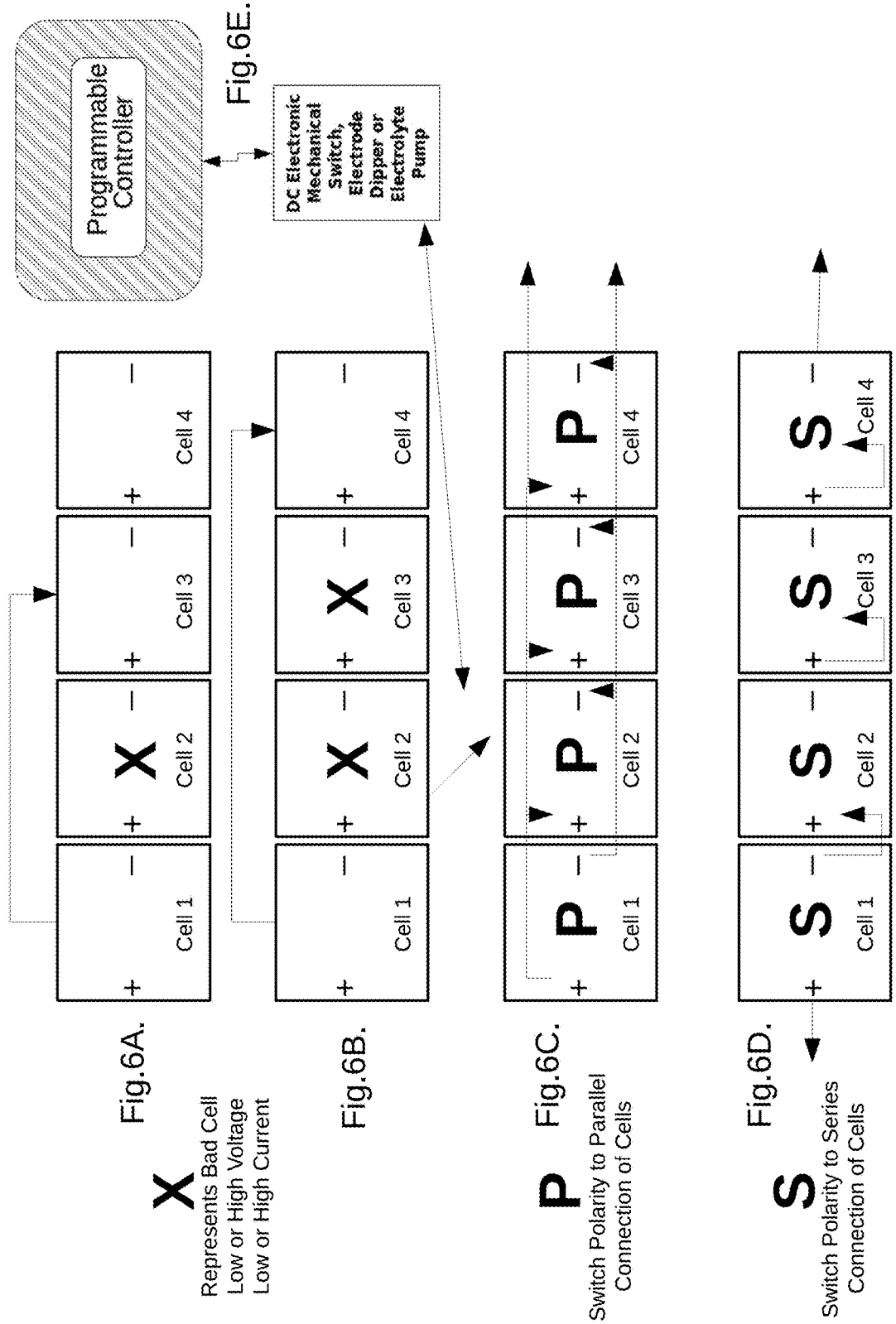

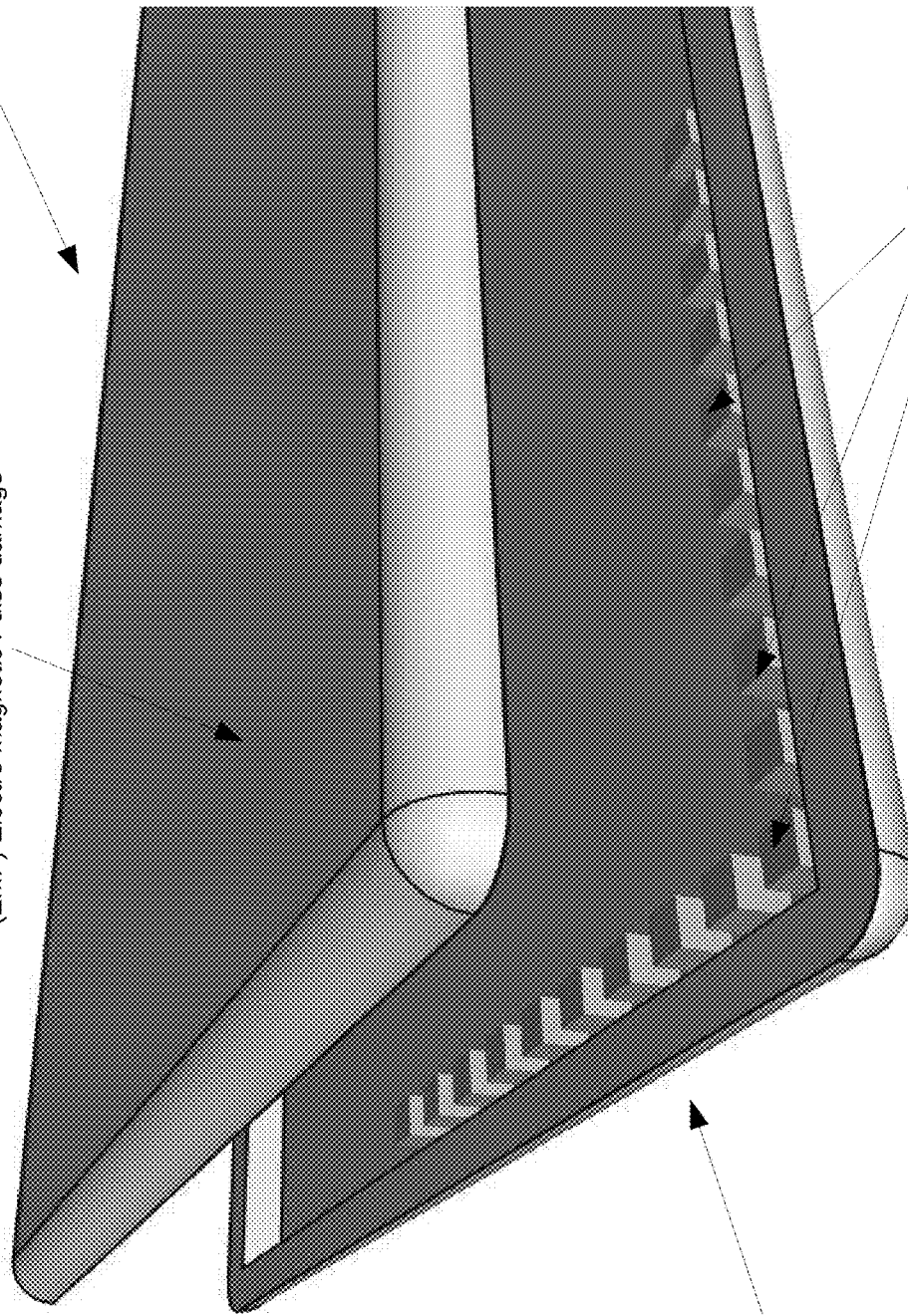
Fig. 7 Case Apparatus Assembly with Cathode and Anode Built into 3D Additive Printed and Manufactured Structure of the Booster Apparatus
Fig. 7A. Outer coating on outside case is a patterned Graphene grid creating a Faraday cage built into the case for protection from (EMP) Electro Magnetic Pulse damage
Fig. 7B. Cathode
Fig. 7C. Anode
Fig. 7D. Generator Cells

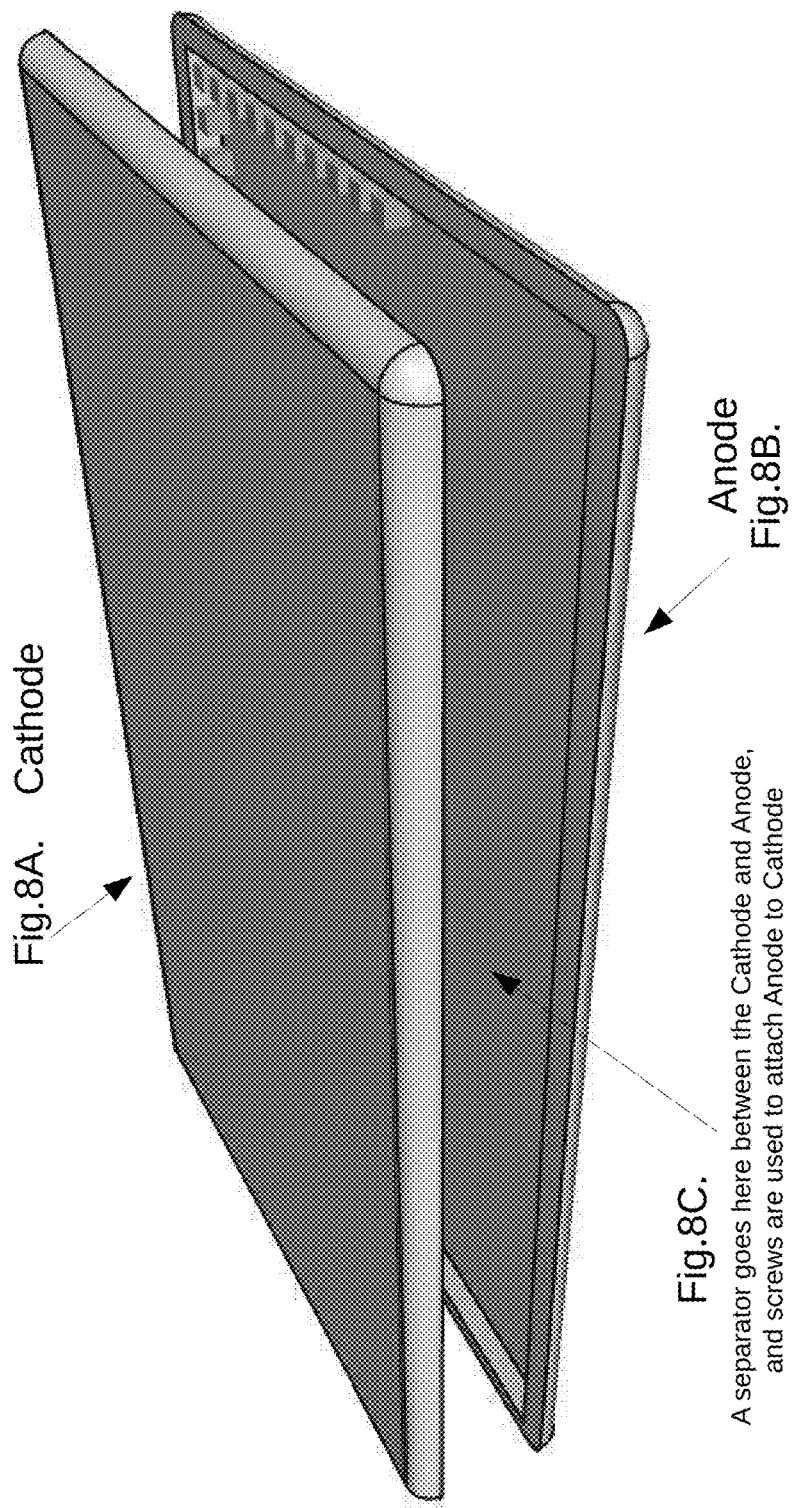

Fig. 8  3D Printed Case with Layers of Materials to Create Anode and Cathode of the Booster Apparatus The surfaces are created utilizing additive 3D printing processes, to create conductive surfaces. The purpose of manufacturing in this way, with this method reduces the assembly, and cost of manufacturing the Booster Apparatus.

Fig.8A.  Cathode

Fig.8B.  Anode

Fig.8C. A separator goes here between the Cathode and Anode, and screws are used to attach Anode to Cathode

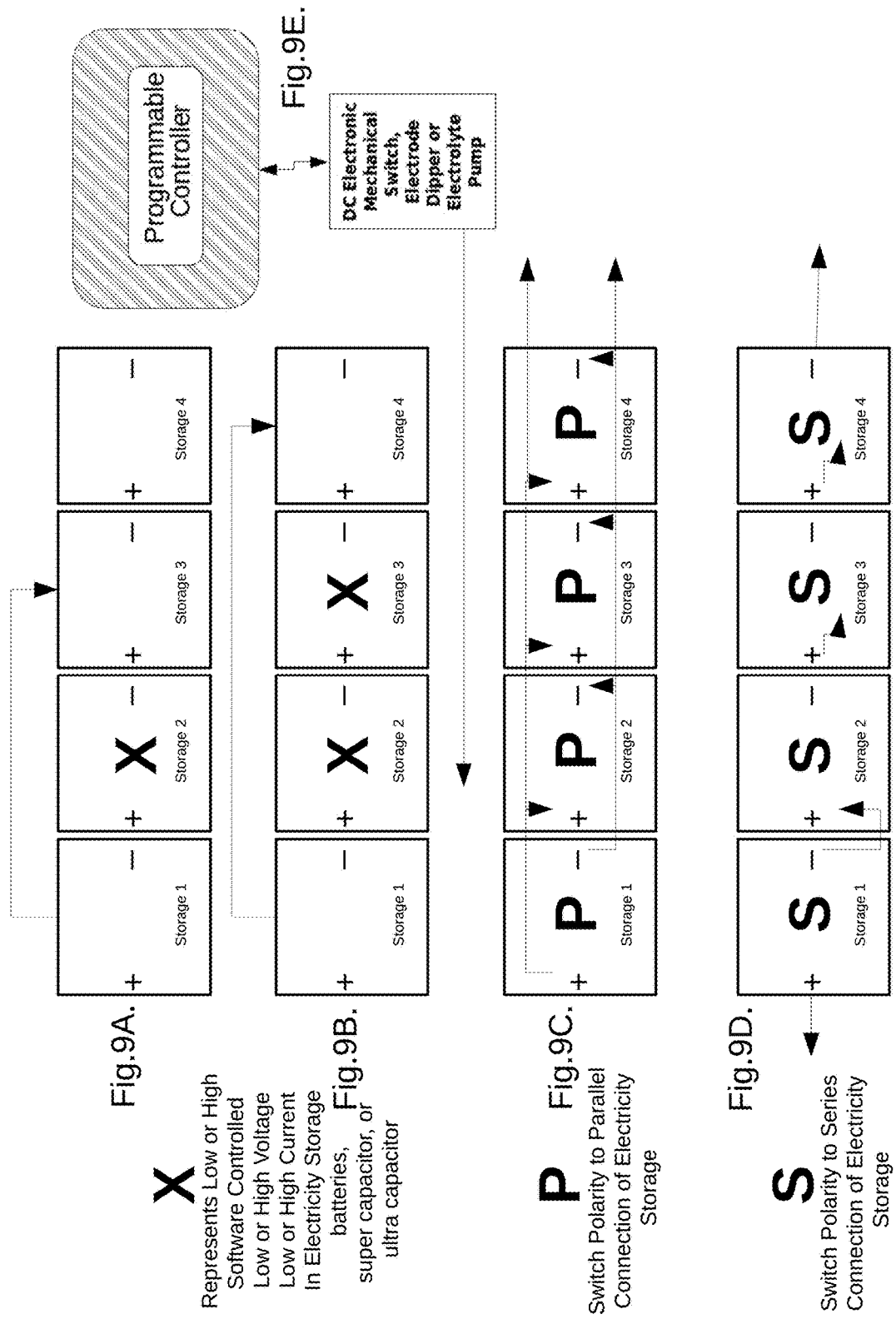

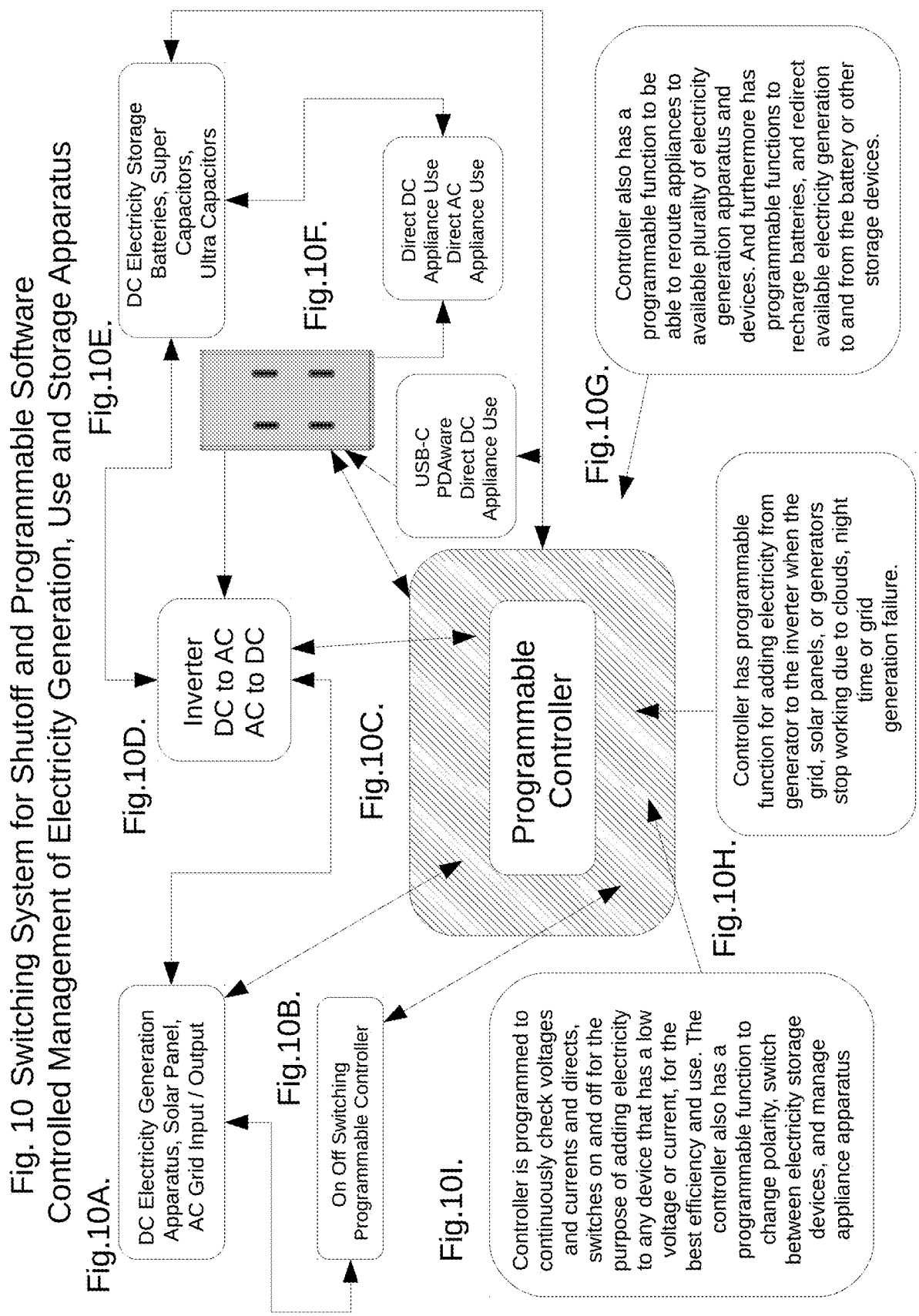
Fig. 10 Switching System for Shutoff and Programmable Software Controlled Management of Electricity Generation, Use and Storage Apparatus

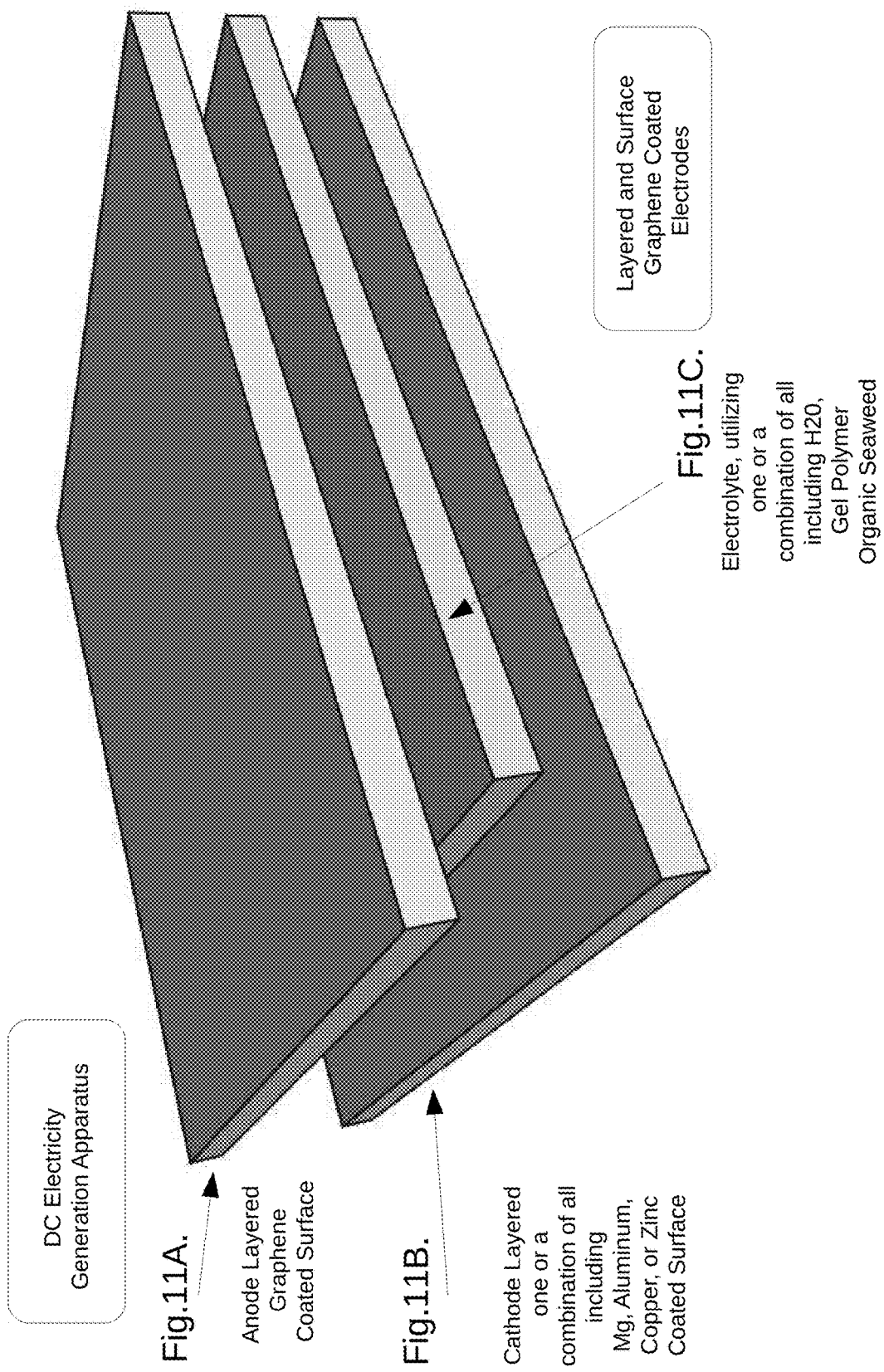

Fig. 12 Alternative Energy Booster Apparatus
DC Electricity USB-C PDAware Wall Adaptor apparatus Wall plate with USB-C PD Aware Plugin Sockets A plurality of USB-C PD Aware Power Delivery wall jacks that are able to pull +12v from a USB power source assuming the device is telling the power source that it is ready to receive the +12v

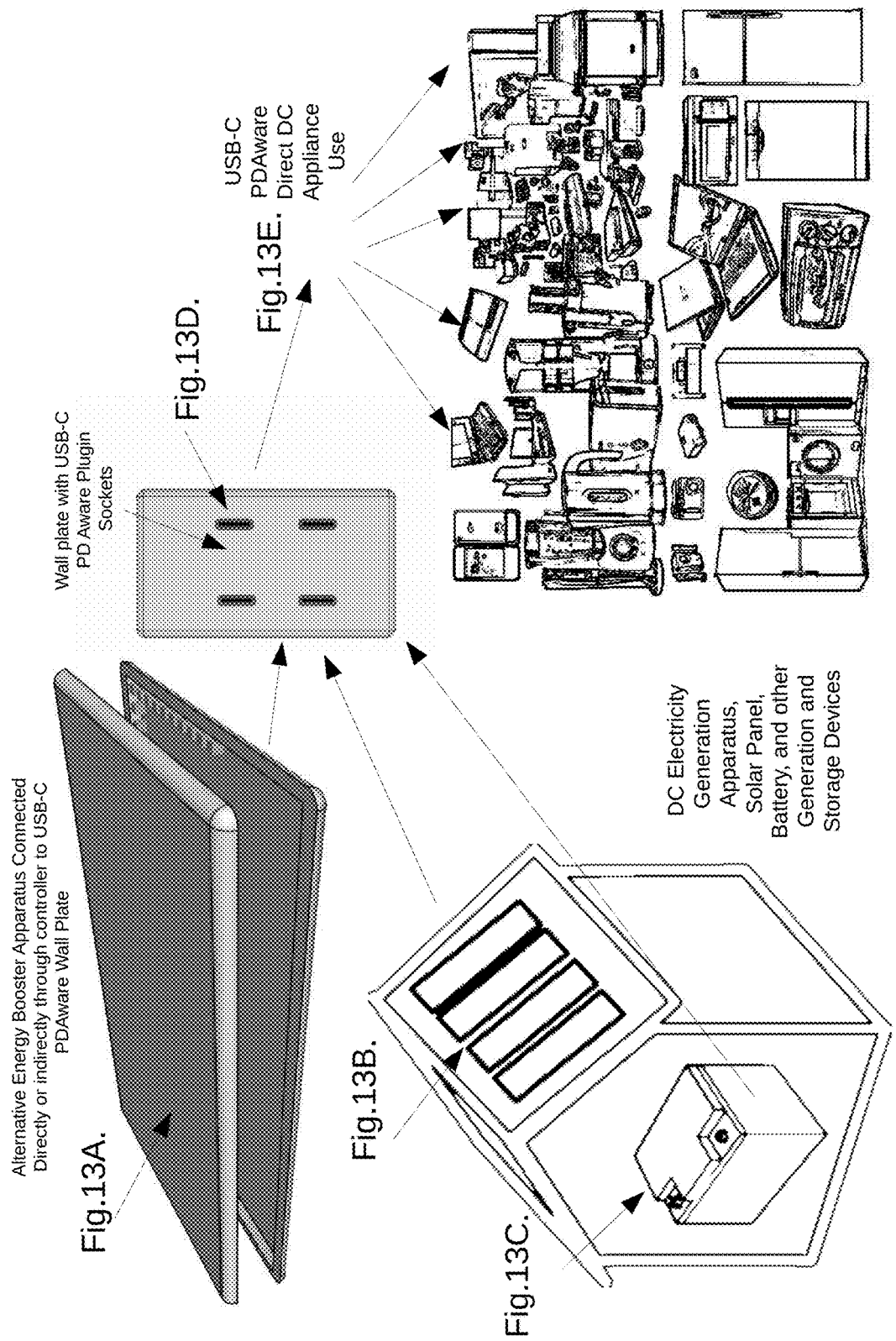
Fig. 13 Alternative Energy Booster Apparatus and other DC Electricity Sources for 12 volt or higher DC Electricity transferal to USB-C PDAware Wall Adaptor apparatus

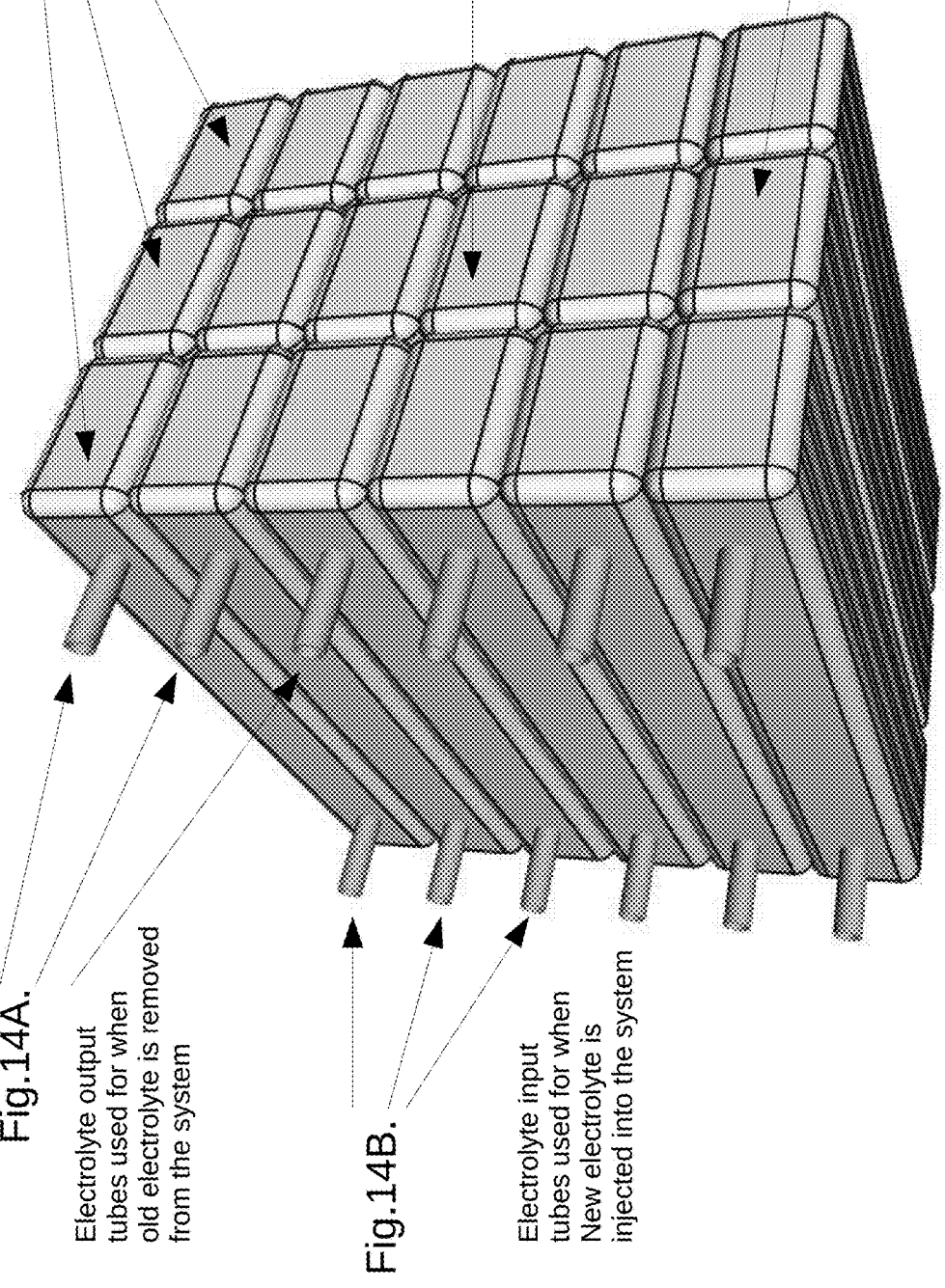
Fig. 14 Electrolyte Pumping Apparatus for Plurality of Cells with Electrode Cell Casings, and Programmable Controller for Electrolyte Delivery Fig. 15 Top View of Multiple Cells in Apparatus Showing Electrodes Top view of the
Electrolyte cell container
Showing the plurality of
- Cathodes Top view of the
Electrolyte cell container
Showing the + Anode
graphene casing Top view of the
Electrolyte cell container
Showing the injection
tubes inside the + Anode
graphene casing Fig. 16 Expanded View of Cell Array of the Apparatus and Functions

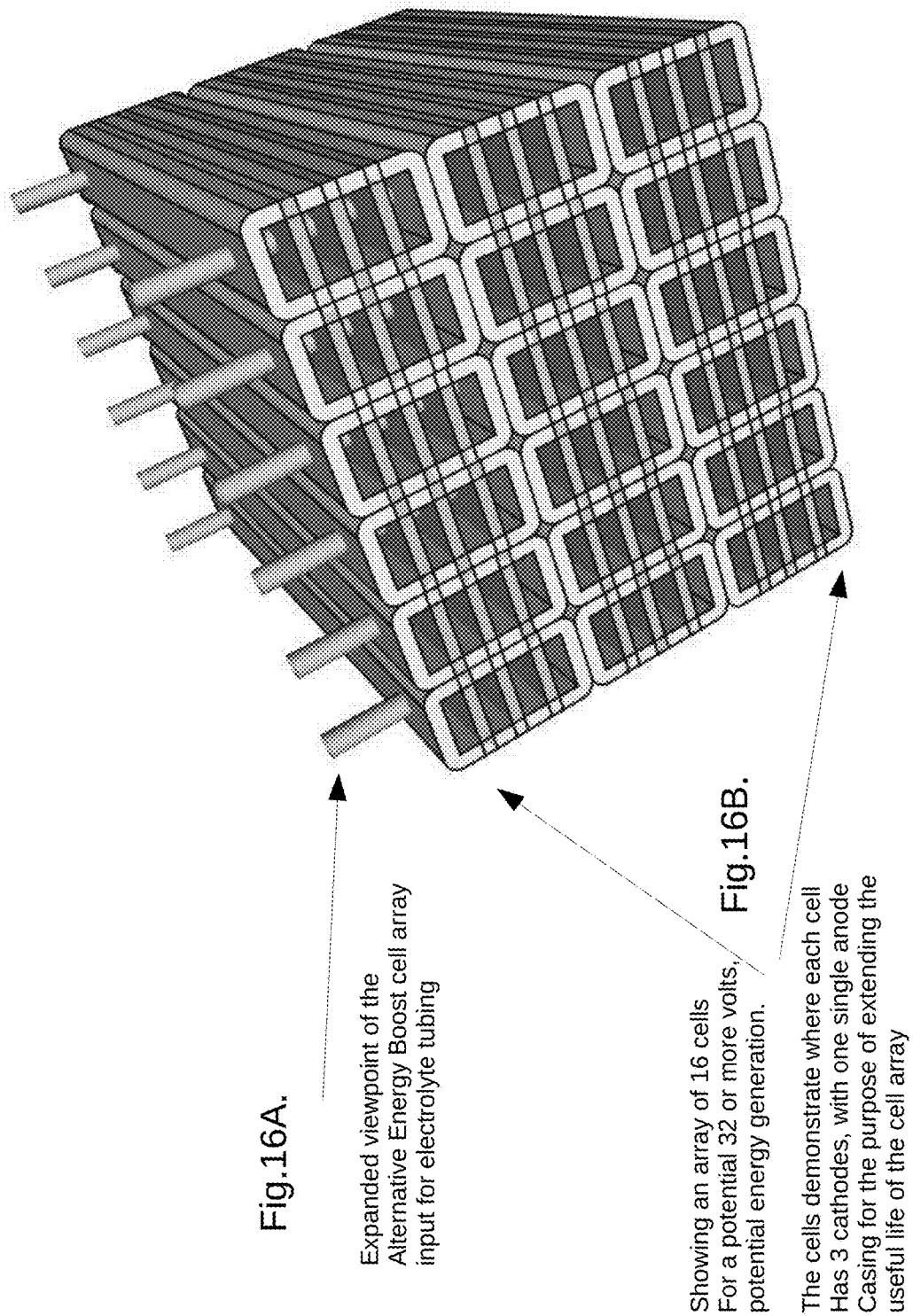

Fig.16A.

Expanded viewpoint of the
Alternative Energy Boost cell array
input for electrolyte tubing

Fig.16B.

Showing an array of 16 cells
For a potential 32 or more volts,
potential energy generation.

The cells demonstrate where each cell
Has 3 cathodes, with one single anode
Casing for the purpose of extending the
useful life of the cell array

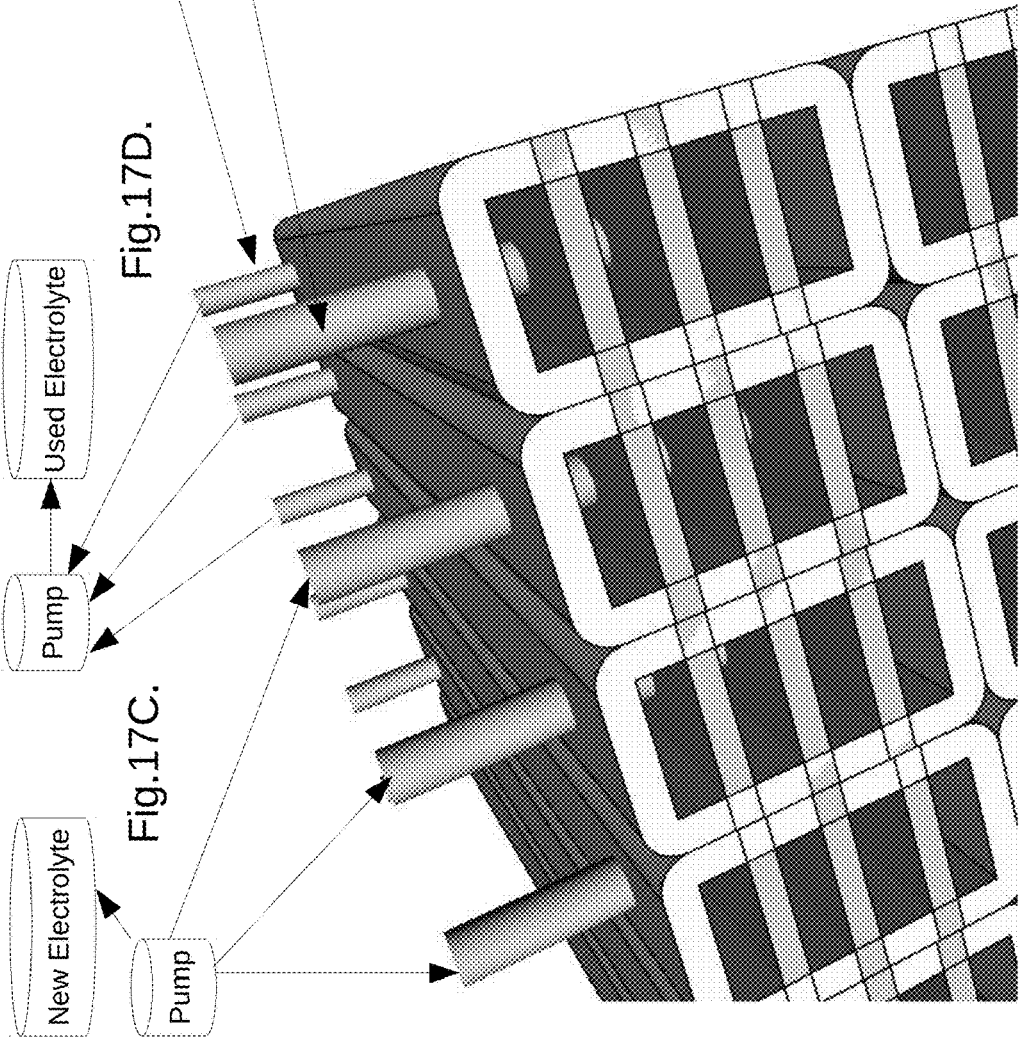

Fig. 17 Placement of Input and Output Electrolyte Delivery Apparatus Describing Disbursal and Refurbishment with Pump in System Fig.17A. Electrolyte output tube from top view Fig.17B. Electrolyte input Tube from top view

The placement of the input tubes at the top of the cell, provides New Electrolyte disbursal And refurbishment of the electronic cells from the top to the bottom so that the pump can Create suction at the bottom, and pressurized Flow of gel or liquid electrolyte through the top tubes.

The purpose of the electrolyte injection apparatus Is to keep the electrolyte fresh and at the right density, And in a solid state of gel polymer for maximum energy Creation, Transferal of electrons, and protection of the electrode materials in the presented apparatus.

All of these functions with the ability to manage the Pumping and refurbishment of the apparatus cell Remotely utilizing a programmable controller for Electronical management of the mechanism in the Apparatus.

Fig. 18 Sacrificial Electrode Stack with Timer Acrylic Polymer Coating Apparatus

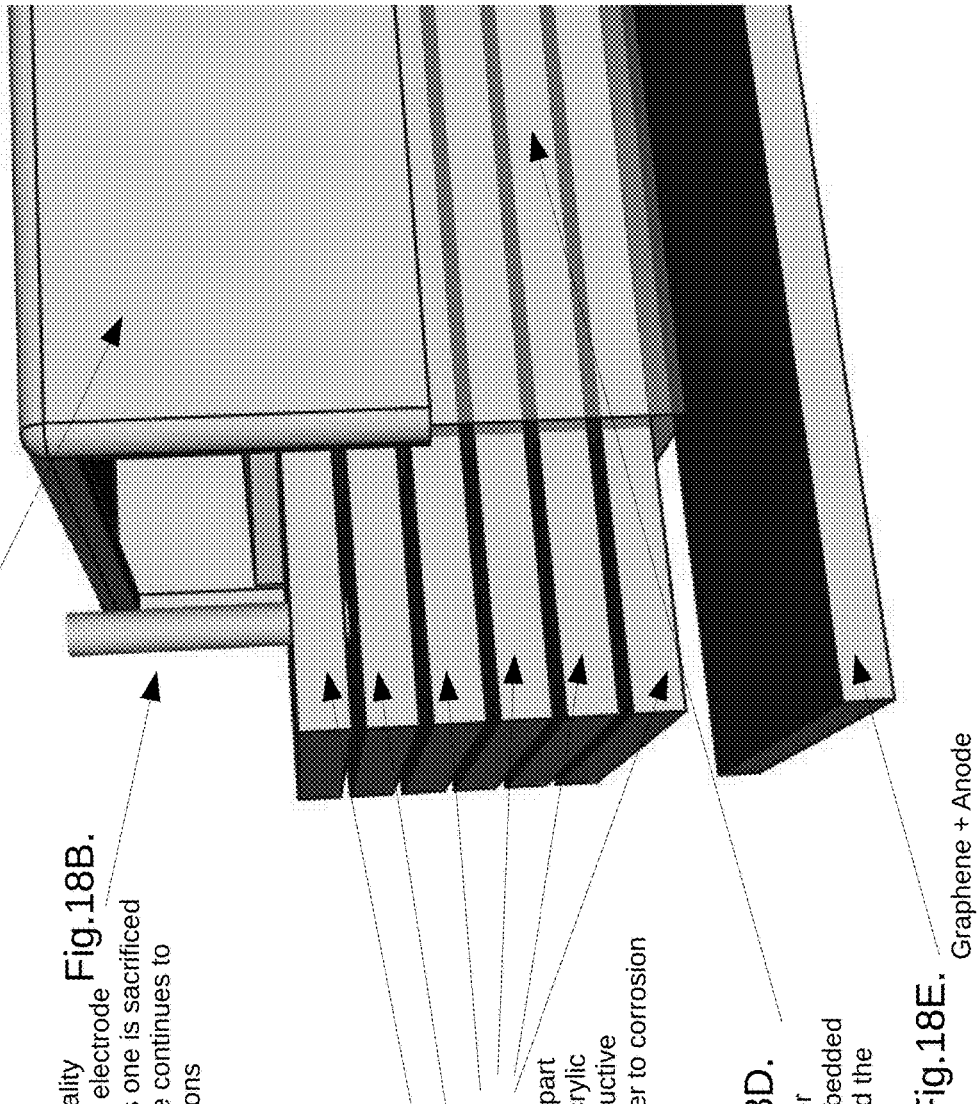

Fig.18A. Non Conductive case cover for all the - cathode Electrodes embedded in Acrylic conductive polymer

Fig.18B. Multiple Plurality Of - cathode electrode connector as one is sacrificed The next one continues to create electrons

Fig.18C. Plurality of - cathode Electrodes spaced apart And embedded in acrylic Polymer that is conductive As a protective barrier to corrosion

Fig.18D. Acrylic polymer timer Barrier between embedded - Cathodes to extend the Life of the cell

Fig.18E. Graphene + Anode

Fig.18F. Timer acrylic conductive polymer coatings are applied where one coating makes the electrode last for 2 months, and there by applying Multiple coatings Multiplies and extends The life span of the cell In the apparatus here presented.

Having a plurality of electrodes provides the benefit to the Alternative Energy Boost Apparatus by utilizing multiple Sacrificial Electrodes, there by providing a longer useful life of the cell, before any regeneration takes place.

In the presented Apparatus and System Sacrificial Anodes and Cathodes are used to reduce corrosion of key important electrodes, to extend the life and efficiency of the presented Apparatus.

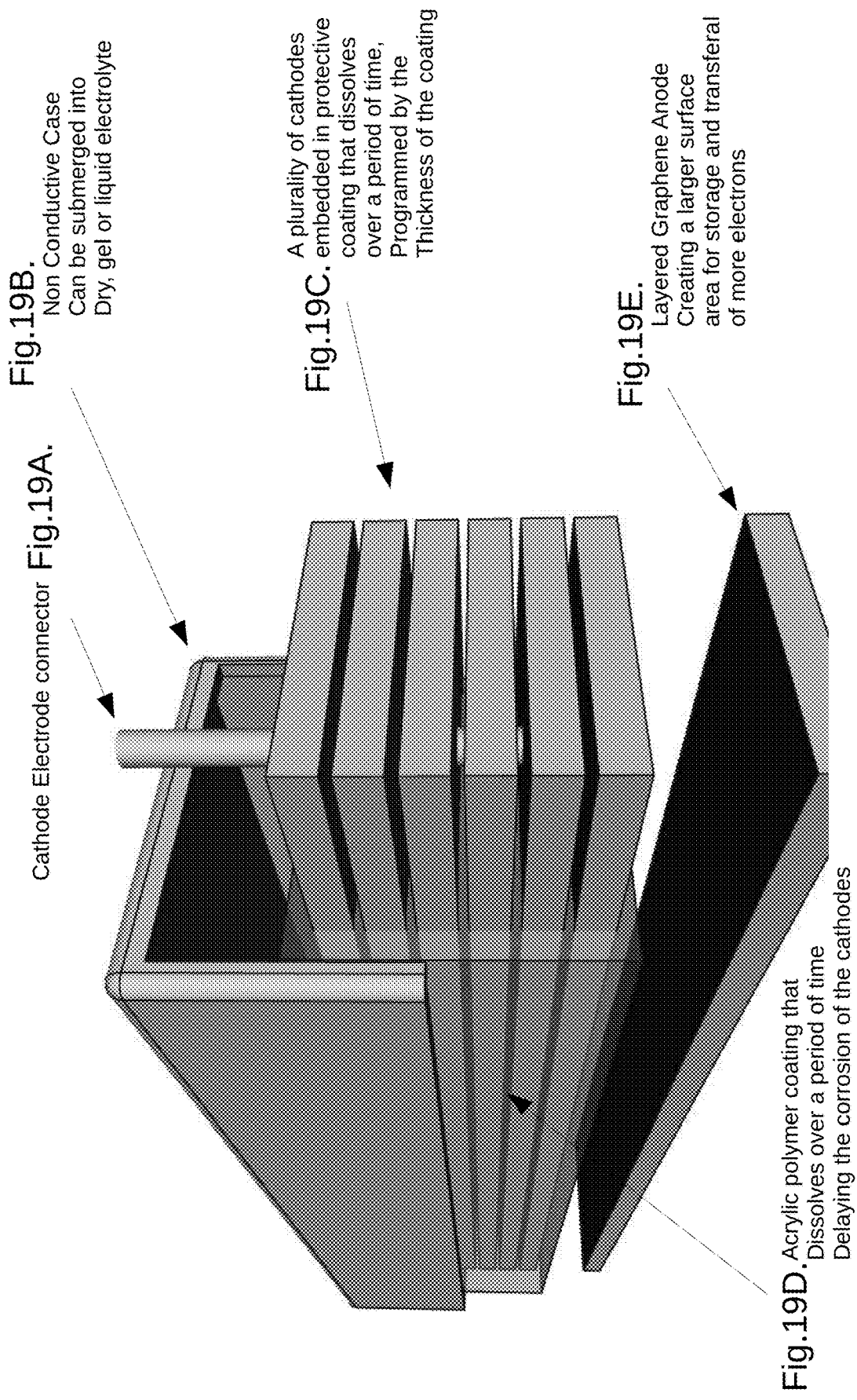

Fig. 19 Top View of Cathode Assembly in the Apparatus with Plurality of Cathodes Fig.19A. Cathode Electrode connector Fig.19B. Non Conductive Case Can be submerged into Dry, gel or liquid electrolyte Fig.19C. A plurality of cathodes embedded in protective coating that dissolves over a period of time, Programmed by the Thickness of the coating Fig.19D. Acrylic polymer coating that Dissolves over a period of time Delaying the corrosion of the cathodes Fig.19E. Layered Graphene Anode Creating a larger surface area for storage and transferal of more electrons Fig. 20 Dual Cell Configuration of Low Density and High Density Electrolyte

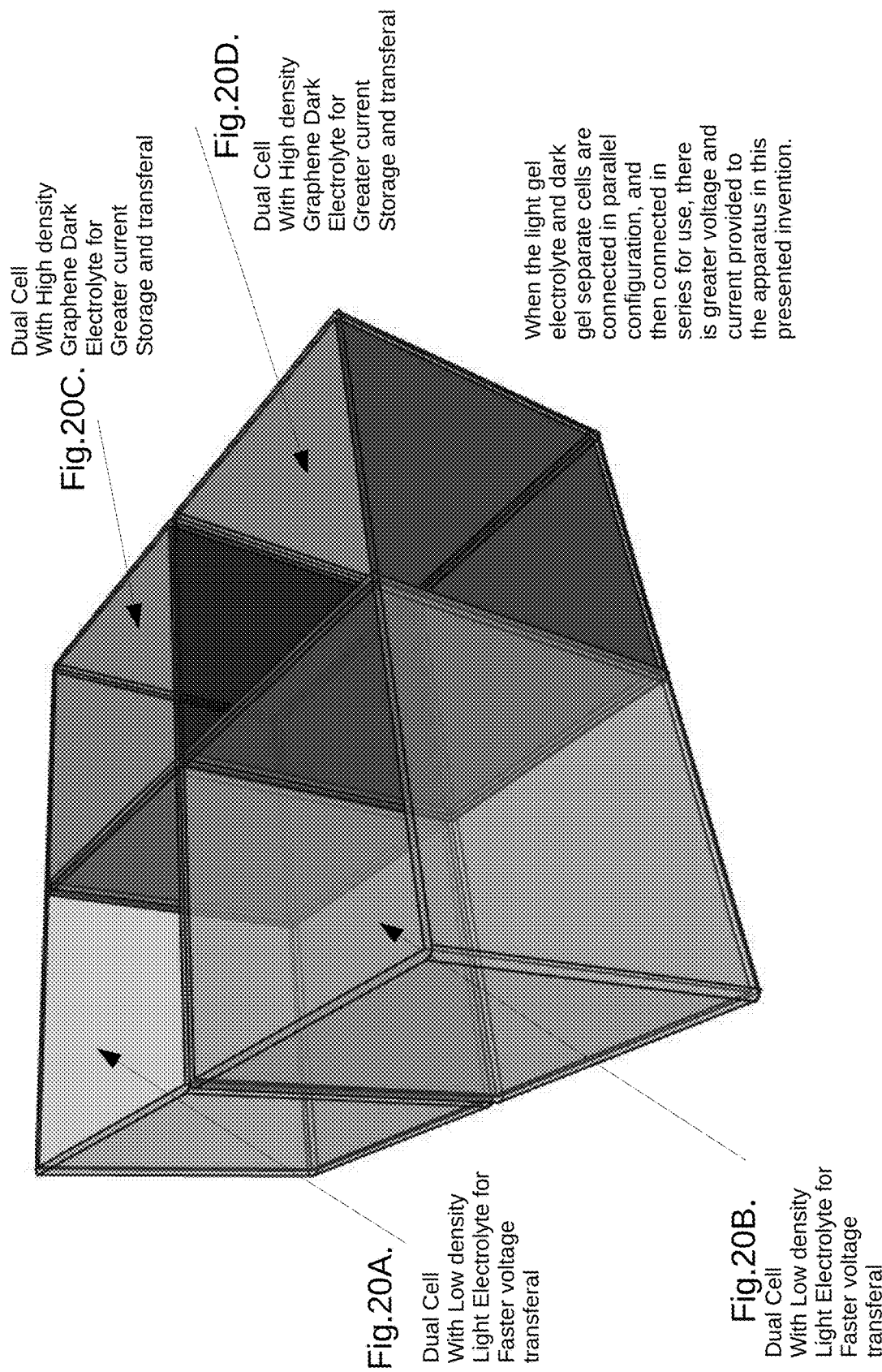

Fig.20A. Dual Cell With Low density Light Electrolyte for Faster voltage transferal Fig.20B. Dual Cell With Low density Light Electrolyte for Faster voltage transferal Fig.20C. Dual Cell With High density Graphene Dark Electrolyte for Greater current Storage and transferal Fig.20D. Dual Cell With High density Graphene Dark Electrolyte for Greater current Storage and transferal When the light gel electrolyte and dark gel separate cells are connected in parallel configuration, and then connected in series for use, there is greater voltage and current provided to the apparatus in this presented invention.

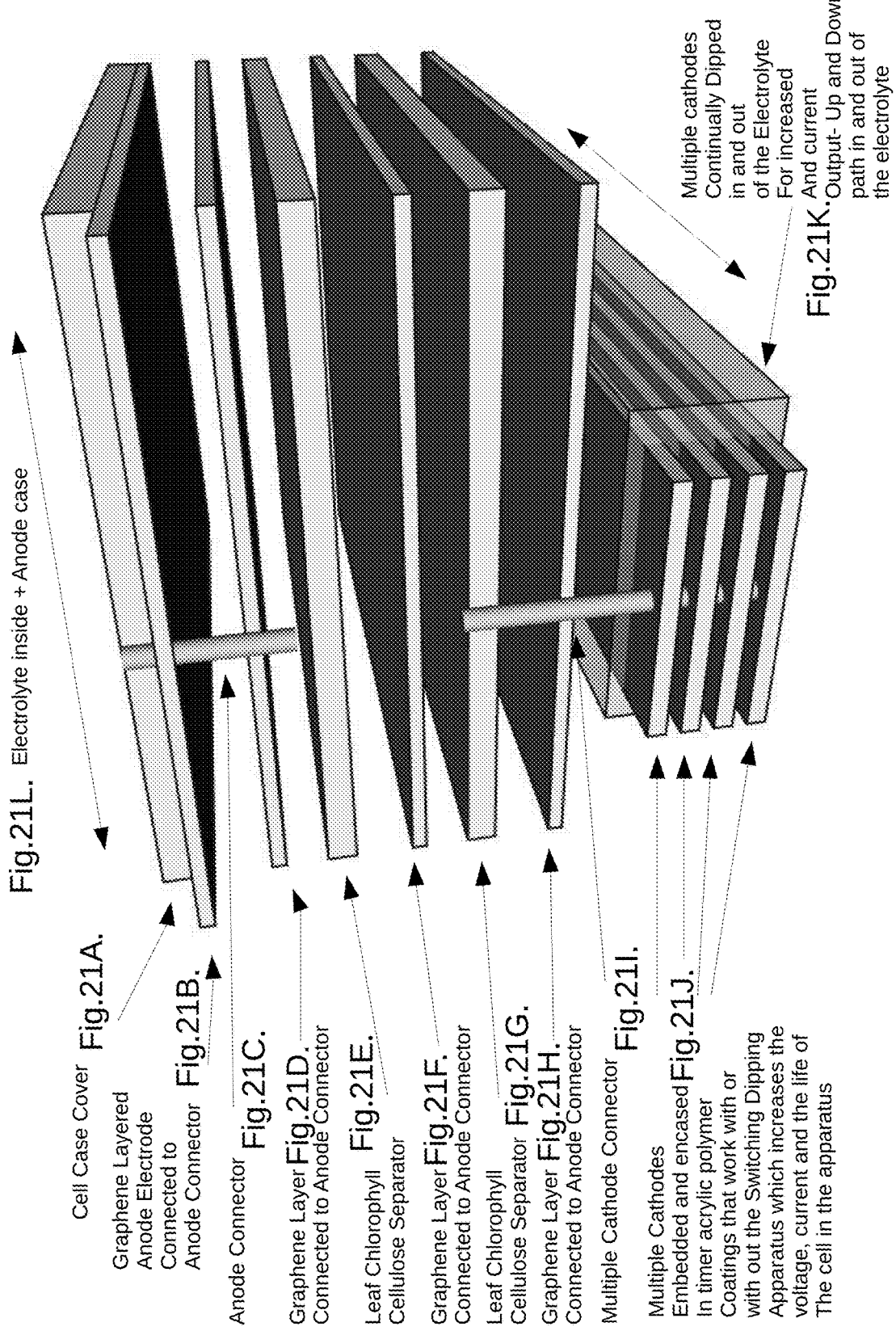

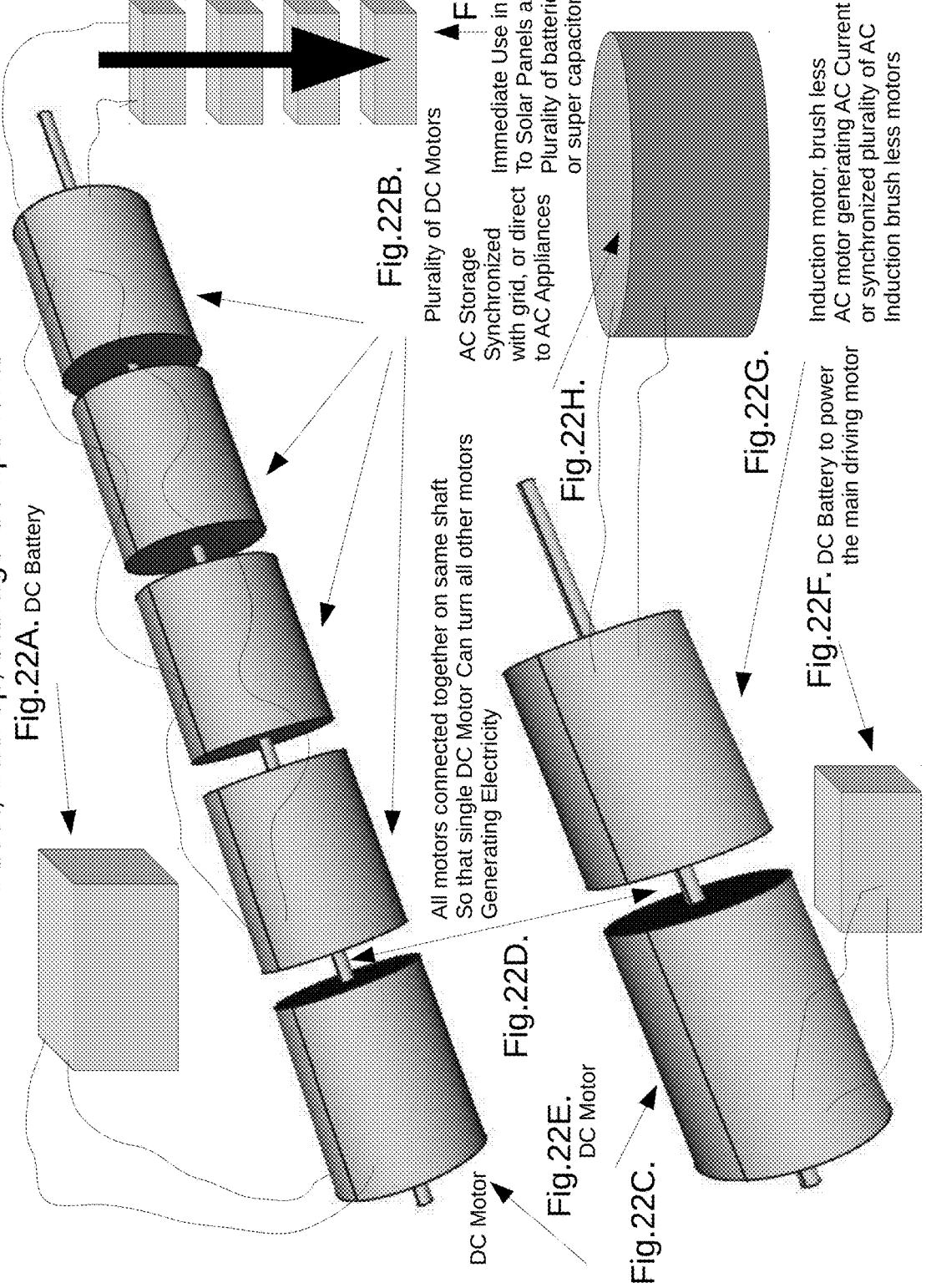

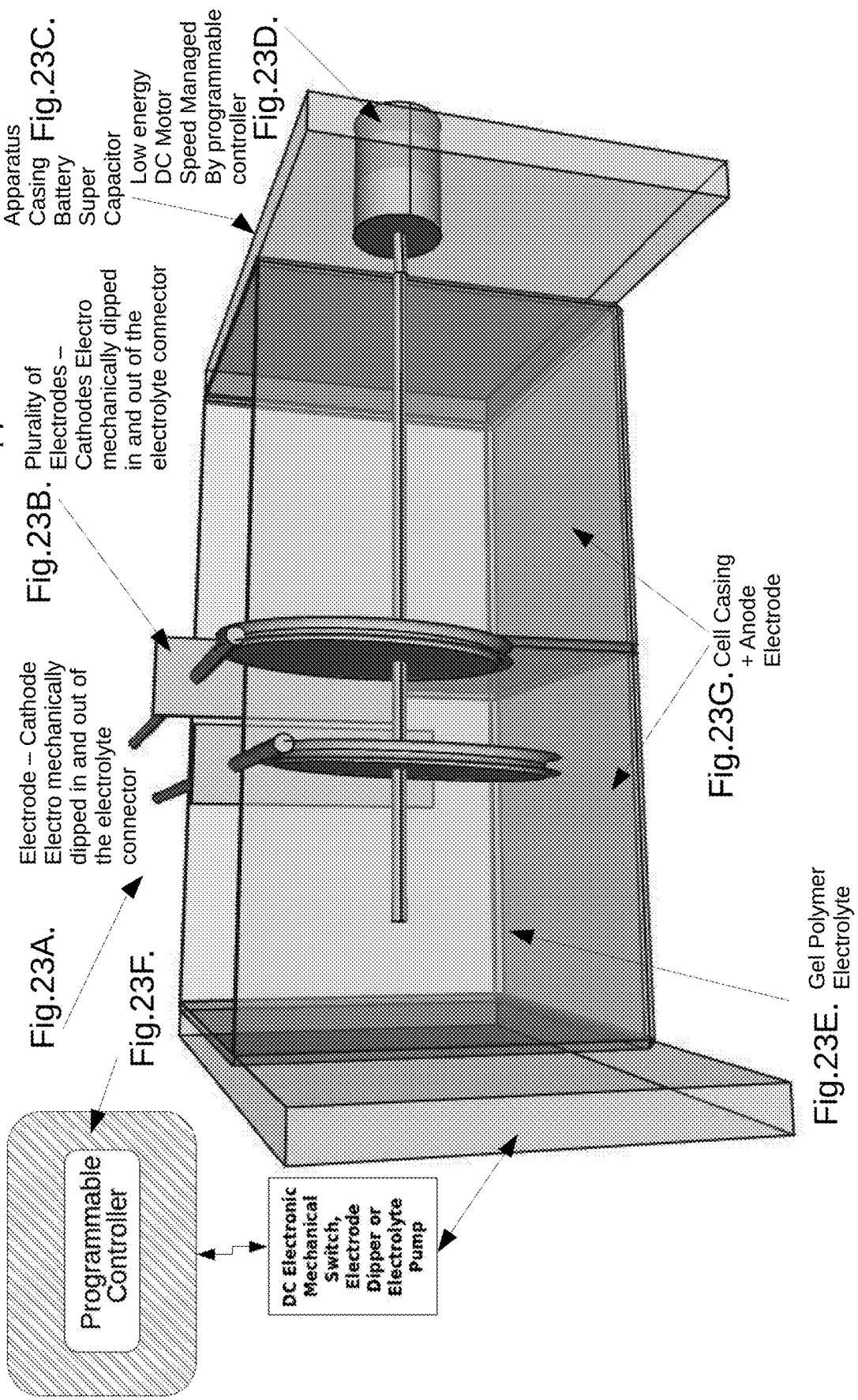
Fig. 23 Electro Mechanical Dipper Switching System for Switching Off and On Electrodes Within Cells in Presented Apparatus Fig. 24 Sacrificial Anode Cathode Layered Timer Electrodes

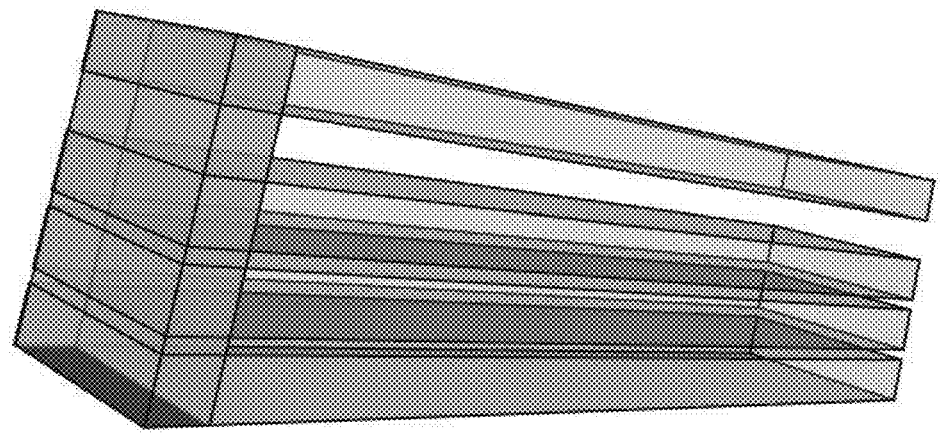

Fig.24B.
Cell top connector
Plurality of sacrificial
Cathodes for
Connecting
Multiple cells in
parallel or series
configurations Fig.24C.
Multiple cathodes
Embedded in timer
Coatings, sacrificial
One at a time
For extended life
Of the cell
apparatus Fig.24A.
End of cell with
Plurality of
sacrificial cathodes
And single outside
Of cell connector

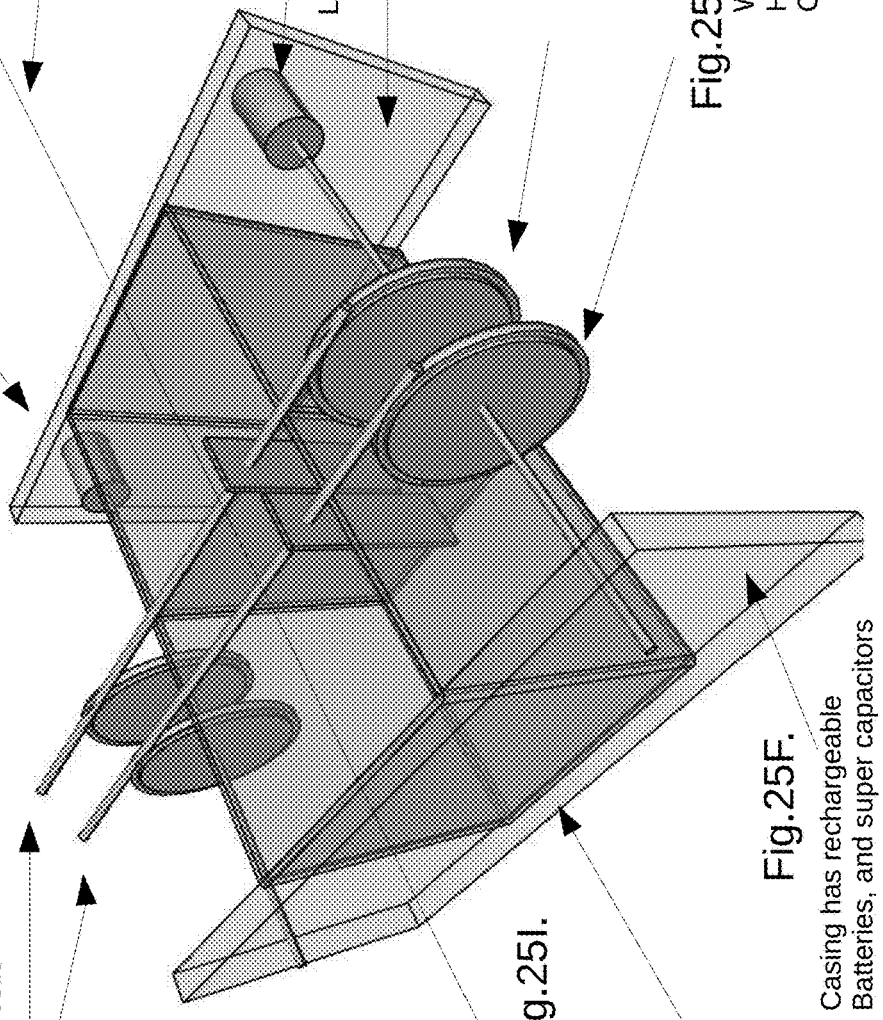
Fig. 25  Electro Mechanical Dipper Switching System for Switching Off and On Cells in Apparatus

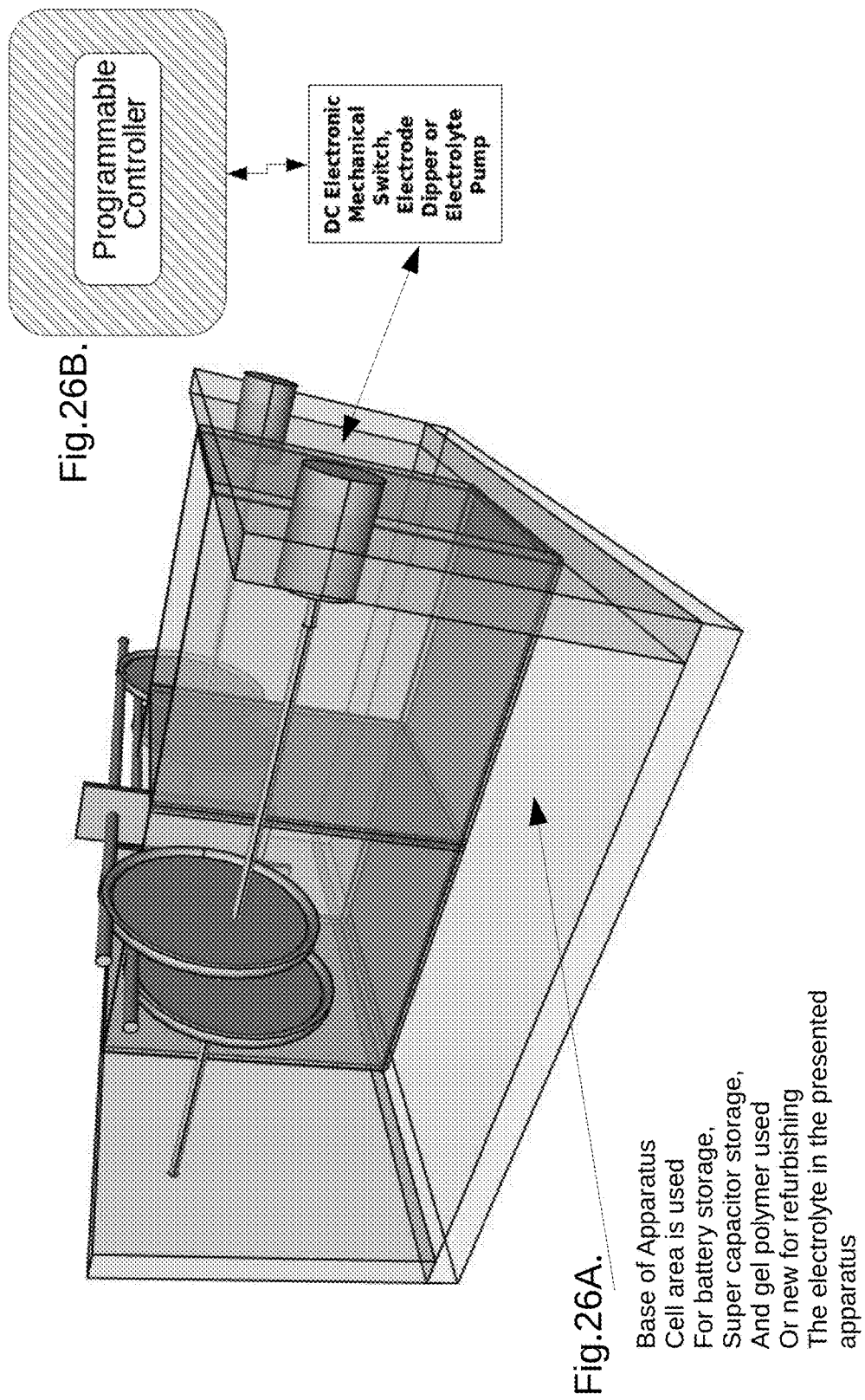
Fig. 26 Electro Mechanical Dipping Switching System for Switching Off and On Cells in Apparatus

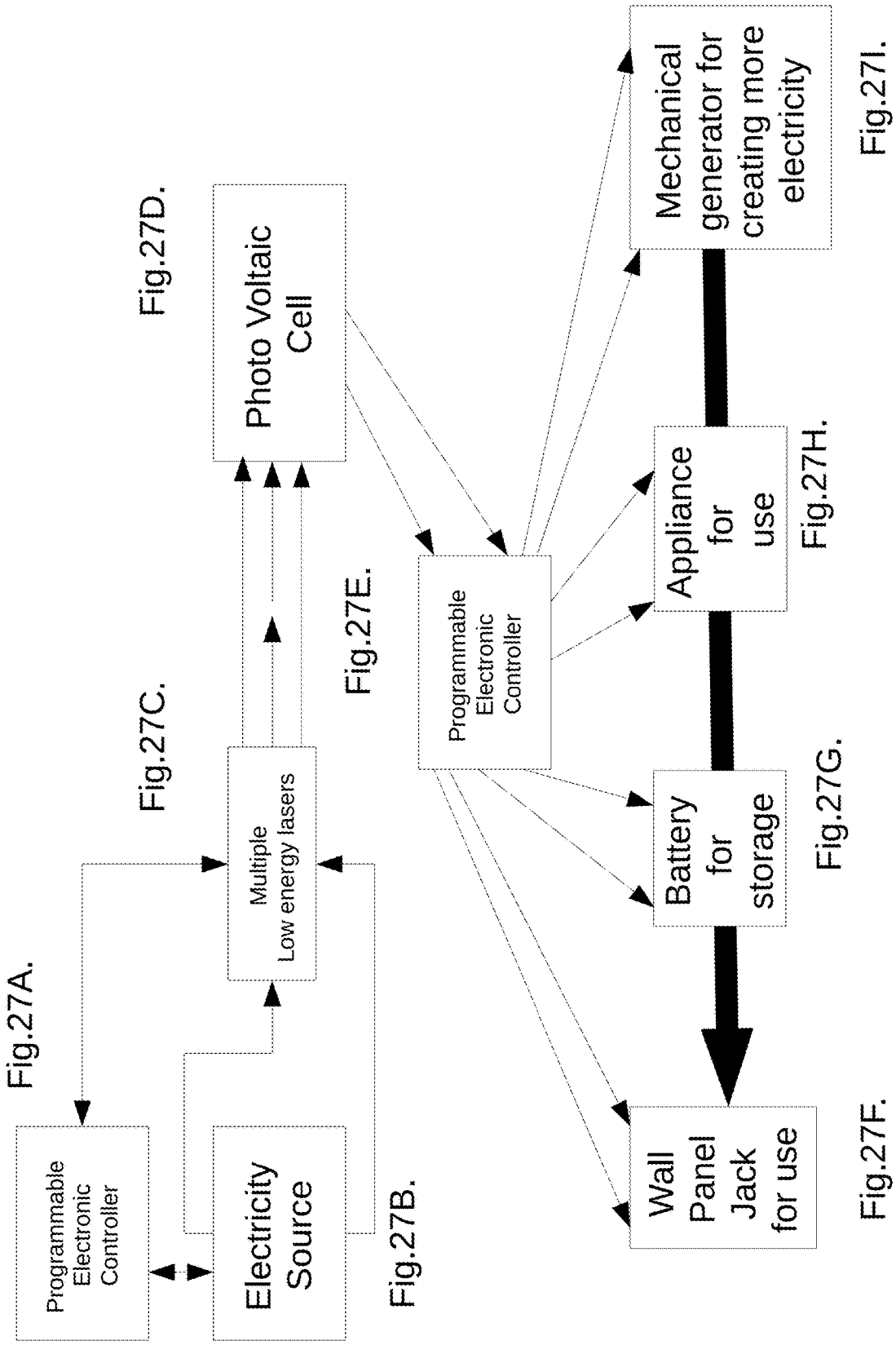
Fig. 27 Wireless Electrical Transferal Component of the Apparatus

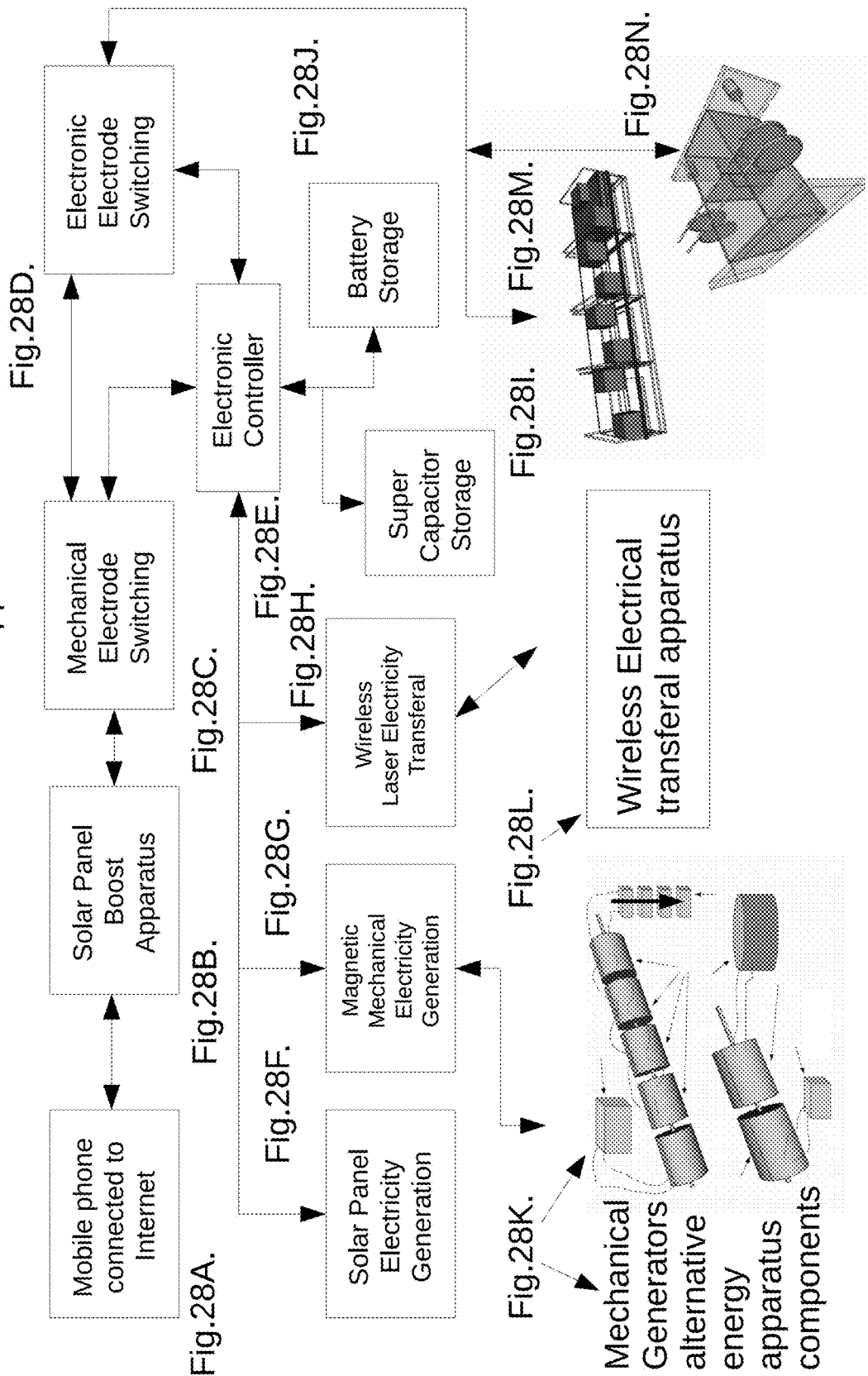
Fig. 28 Mobile Phone Payment System Connected to mechanically and electronically Shutting off of Cells, Modifying Polarity and reducing energy output of the Solar Panel Boost Apparatus

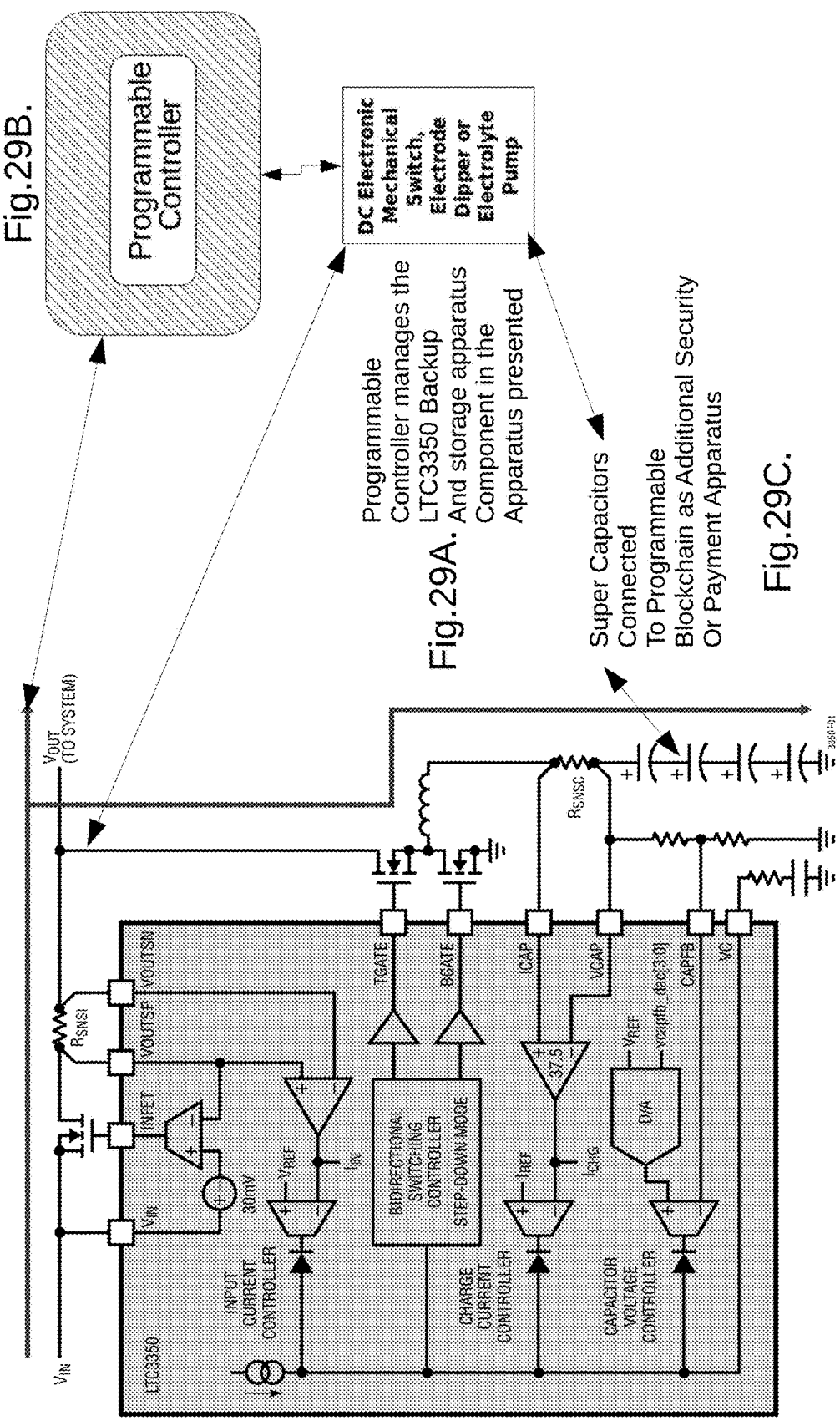
Fig. 29 Switching System for Shutoff of Cells and Modifying Polarity and Backing up Electricity, Storage of Electricity and Night Time Use Of Electricity Fig. 30 Switching System for Shutoff of Cells and Modifying Polarity and Backing up Electricity, Storage of Electricity and Night Time Use Of Electricity

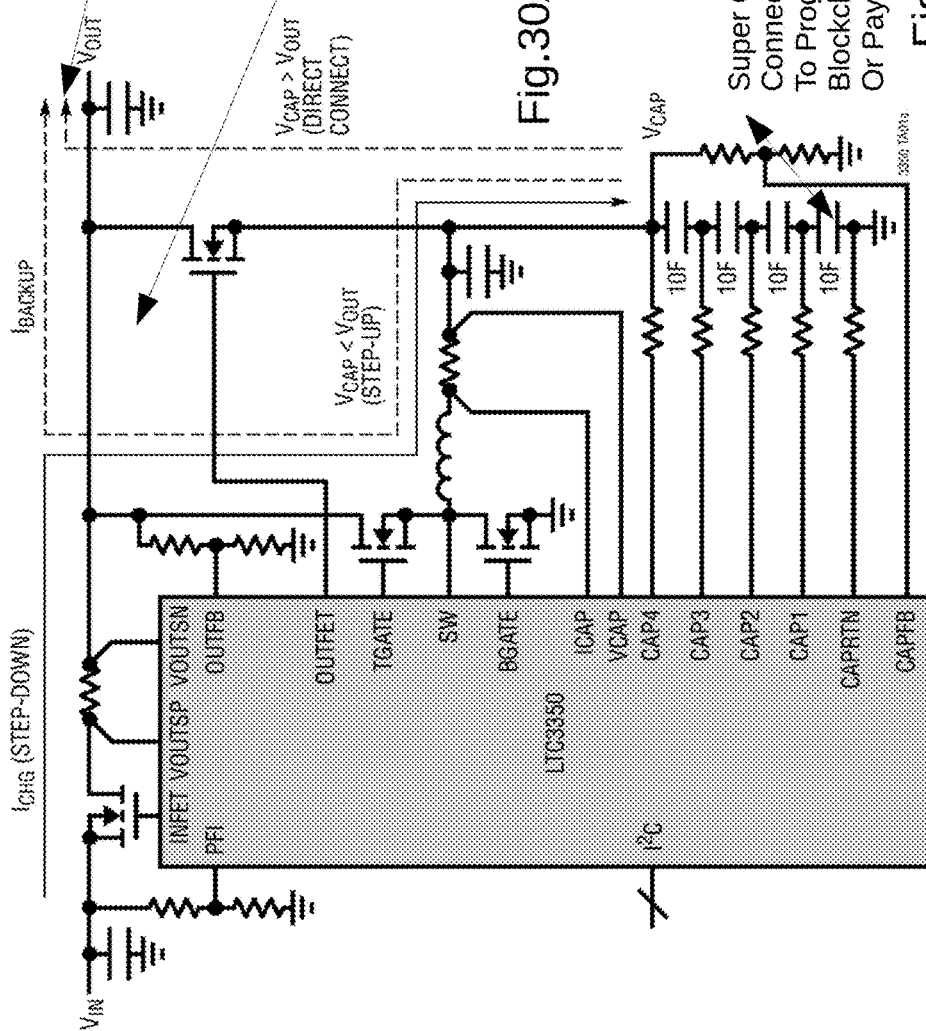

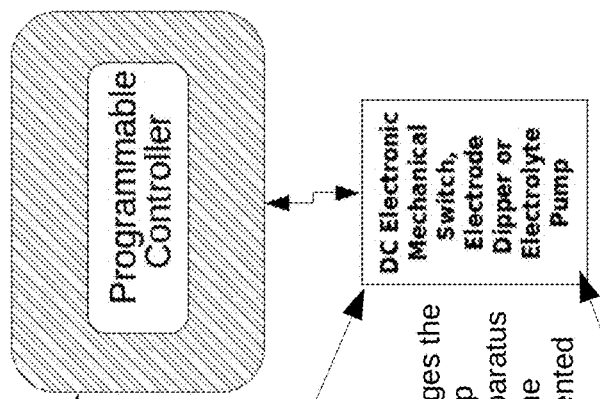

Fig.30A. Programmable Controller manages the LTC3350 Backup And storage apparatus Component in the Apparatus presented

Fig.30B.

Fig.30C. Super Capacitors Connected To Programmable Blockchain as Additional Security Or Payment Apparatus

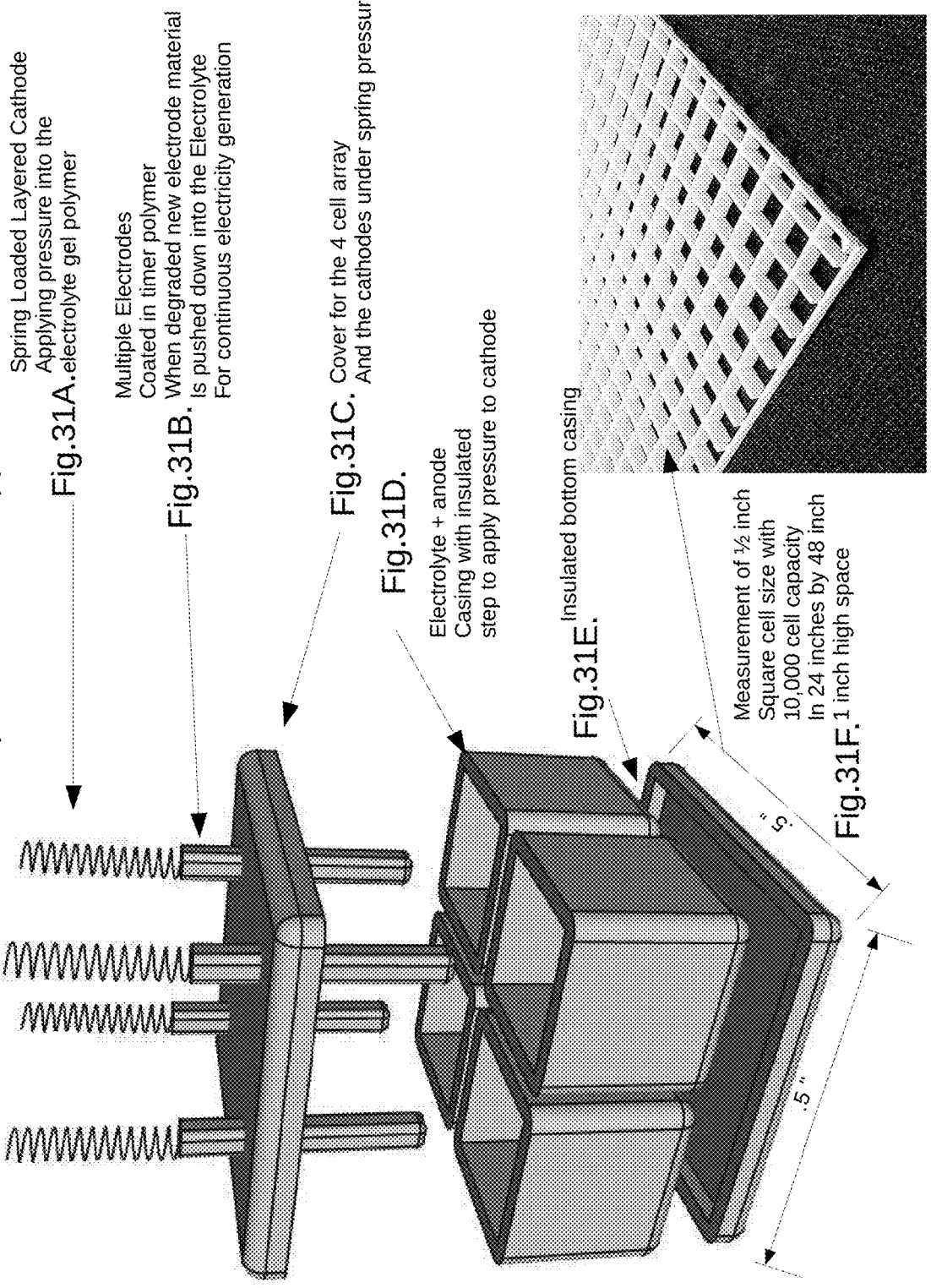

Fig. 31 Low Cost 4 Cell Switching System 6 to 8 volts with Autonomous Layered Cathode Apparatus Fig.31A. Spring Loaded Layered Cathode Applying pressure into the electrolyte gel polymer Fig.31B. Multiple Electrodes Coated in timer polymer When degraded new electrode material is pushed down into the Electrolyte For continuous electricity generation Fig.31C. Cover for the 4 cell array And the cathodes under spring pressure Fig.31D. Electrolyte + anode Casing with insulated step to apply pressure to cathode Fig.31E. Insulated bottom casing Fig.31F. 1 inch high space Measurement of ½ inch Square cell size with 10,000 cell capacity In 24 inches by 48 inch Fig. 32 Potential Energy Switching System for the Capture of Maximum Energy in Apparatus Fig.32A. Graph showing the initial 3 to 5 second pulse of energy created by The apparatus cell structure Fig.32B. Graph showing the settle down Energy equilibrium in the apparatus Cell structure Fig.32C. The dipping switching apparatus Which is a core component of The presented apparatus captures The first 2 to 5 seconds of energy And stores it in super capacitors, Storage devices, utilizes it Continually 24 hours a day, and increases the lifespan, and energy In the presented apparatus

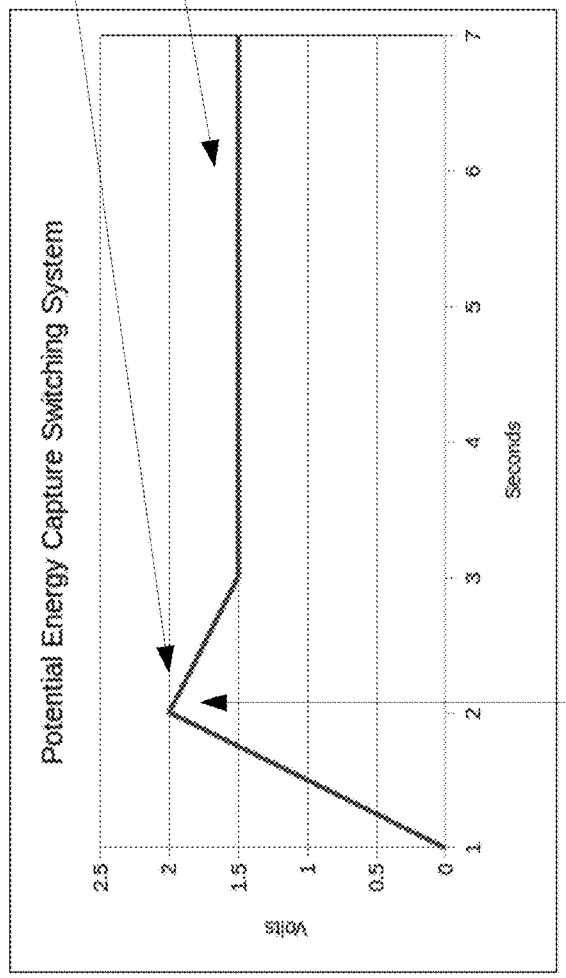

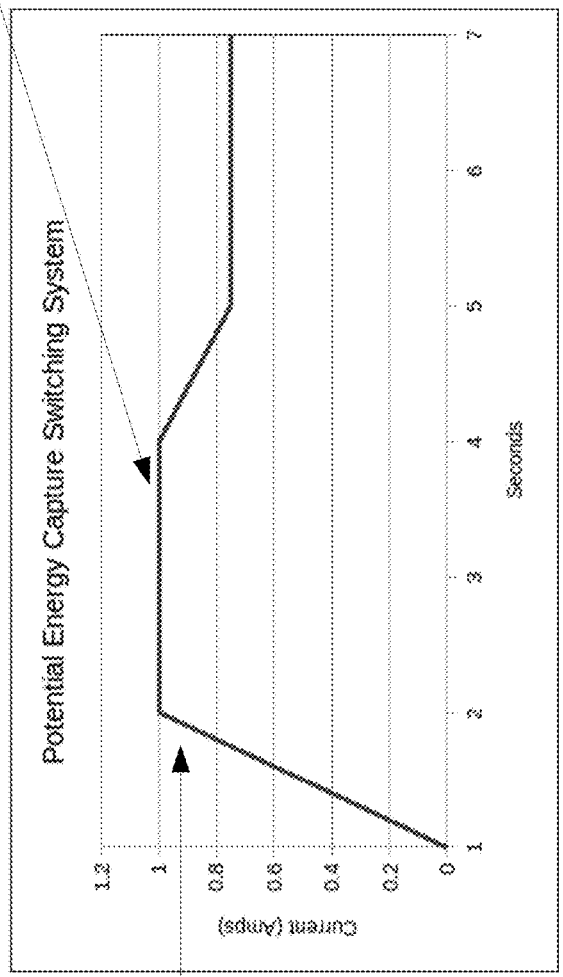

Fig.32D.
Voltage meter readings of the presented alternative energy apparatus cells showing where the cell in the first 3 to 5 seconds has a higher energy potential

ALTERNATIVE ENERGY BOOSTER APPARATUS

The present patent application claims priority to the earlier filed provisional patent application having Ser. No. 62/419,848, and hereby incorporates subject matter of the provisional patent application in its entirety.

BACKGROUND

Field of the Invention

The Apparatus disclosed here is an Alternative Energy Booster, utilizing organic materials that provides additional electricity to batteries, appliances, inverters and increases the output of electricity from Solar Panels, and electricity generator devices and further provides USB-Type C Power Delivery connectors for powering low energy appliances directly from alternative energy devices, and storage devices.

EXAMPLE: The Apparatus disclosed here is directed to managing, and redirecting the increasing of electricity generation when a Solar Panel or other generator has lower generation of electricity under clouds, at night time, or low water due to drought in Hydro Power generation and adds electricity to make up for the losses of generation.

EXAMPLE: The Apparatus further has the needed functions of running low energy DC Appliances directly, without any outside energy sources, for the purpose of creating energy security during power outages, in places without any energy, in undeveloped lands, in Energy Poverty cultures, and for people who are in places affected by drought, and climate change.

Description of the Related Art

The current state of art involves a plurality of electricity generation apparatus, electricity transformation from DC to AC with a plurality of inverter apparatus, and Use of electricity or Battery Storage with a plurality of apparatus.

Various Electricity Generation Methods available as related art include a plurality of: Static electricity, Electromagnetic induction, Steam, Electro chemistry, Photo voltaic effect, Thermoelectric effect, Piezoelectric effect, and Nuclear Fission, Fusion. Some of which are devastating to life on Earth.

Other related art includes a plurality of Photo Voltaic Solar Panels, Modules, and Power Controllers.

And further related art includes batteries that are not organic, and when they are disposed of they create toxic waste that is harmful to the environment, the water table, people and animals.

SUMMARY

The object of this invention is to provide an apparatus that gets placed between the alternative energy generator device, the use appliance and/or battery storage device for the purpose of increasing electricity generated, to make more energy available.

The process objective of this invention is to be able to increase the current and capacity of the electricity, utilizing software controlled switches, controlled by digital controllers, reacting to a plurality of sensors including voltage and current sensors.

EXAMPLE: In one embodiment of the present invention, a generator is provided that switches between 3 paths when the software programmed sensors determine that the electricity voltage or current has dropped due to clouds, darkness or depletion as related to Solar Panel Photo Voltaic generation, Mechanical Generation and Storage of electricity in device such as a battery.

The 4 pathways for energy generation and storage in the presented invention switched are as follows:
1. To the Inverter for converting DC to usable AC current.
2. To the Electricity Storage device (Battery, Super capacitor etc.).
3. Directly to DC Appliances by way of USB-Type C Power Delivery connectors in a Wall Plate for powering low energy appliances directly from alternative energy devices, and storage devices.
4. From Cell to Cell for the purpose of increasing current and voltage.

EXAMPLE: In another embodiment of the present invention, a switch is provided for the purpose of changing the polarity of circuits whenever the need arises. In the present invention batteries provided currents polarity can be reversed to create DC pulses with similar frequency patterns of AC current, for the purpose of boosting DC currents and voltages.

EXAMPLE: In another embodiment of the present invention, an electronic switching system, as well as a mechanical switching system is provided for the purpose of changing on/off from multiple capacitors, multiple cells or storage devices, utilizing a programmable controller to provide sustainable, stable and dependable current from cells, capacitors, batteries and electronic modules. By having this function as a core component of the apparatus presented here the organic cells are given time to recover during heavy electricity use loads.

EXAMPLE: In another embodiment of the present invention, a computer programmable switch is provided for the purpose of changing circuits with a focus on utilizing sensing information from each single cell, making every cell a "Smart Cell" with a central programmable controller that electronically, mechanically has the ability to be managed, switched on or off, over ridden in case of failure, and polarity changeable utilized to determine whether the circuit should be a DC series or parallel circuit. And that the switch can change from parallel to series connections in all combinations of cells utilized in the apparatus disclosed here for the purpose of increasing energy generated in the apparatus.

EXAMPLE: In another embodiment of the present invention, a computer programmable switch is provided, with a plurality of mechanical dipping switches for the purpose of electronic mechanical dipping of electrodes to capture the highest moment of potential energy. When measured with a meter a Battery shows the settled voltage immediately, when the alternative energy boost cell presented in this invention is measured it goes first to a higher voltage for a brief time then drops to lower voltage every time the cell is measured. The presented invention switching system captures the peak voltage and current, and stores or uses it from a plurality of cells.

EXAMPLE: In another embodiment of the present invention, a computer programmable switch is provided for the purpose of changing circuits to a temporary backup power storage system with Super Capacitors. Backup Power is a common requirement for a wide range of applications whenever the main power source is suddenly unavailable. In the past, these types of high reliability systems used batteries to provide an uninterrupted power source whenever the main supply of power was inadequate or unavailable. However, many issues accompany battery storage, including long charge times, limited battery lifetime and cycle life, safety and reliability concerns, and large physical size. With the new availability of high value electric double layer capacitors, better known as super capacitors, alternate energy techniques in the disclosed apparatus are employed which eliminate many of these issues. Using Batteries combined with Capacitors in the disclosed apparatus reduces costs, toxic non organic environmental damages, and provides a redundant storage solution readily available for use.

Systems relying on batteries for storage power require that a fully charged battery is available at all times with suitable capacity to keep appliances, heating, cooling, or important business machinery working seamlessly. Typically, systems employing battery storage enter a low power standby state whenever the main power fails, and only the critical volatile systems remain powered. Since power failure duration is impossible to predict, such systems require over sized, heavy and expensive batteries to avoid the possibility of appliances not working during a lengthy outage.

Capacitor based storage systems use a different methodology. Unlike battery based systems which provide continuous power during the entire storage time, capacitor based systems require only short-term storage power in order to transfer electricity operation for a minimum necessary amount of time.

There are several advantages to this approach. First of all, the numerous issues associated with batteries can be avoided altogether. There is also no longer a need to oversize the energy storage elements for a worst case storage duration. While the storage power requirements of a capacitor based system are typically much higher than those of a battery based system, the storage energy requirements are generally much lower. Since the cost and size of a storage solution is usually dominated by the storage element, capacitor solutions are often smaller and cheaper. With the emergence of small, relatively inexpensive super capacitors capable of storing numerous Joules of energy, the number of storage applications that can be satisfied with capacitors instead of batteries has grown considerably. The presented apparatus utilizes both Batteries and Super Capacitor configurations combined and managed by a programmable electronic controller for managing charging and energy withdrawal.

The storage capacitor needs to be charged, and ideally this is done in a fast, efficient manner. Since proper storage and use is not possible unless an adequate number of Joules are stored on the storage capacitor, many applications require that charging is completed by the time the system boots up and is ready for operation. Hence, high charge currents are generally desirable, and since super capacitors typically have a max operating voltage of 2.7V, it is common and often necessary for several to be stacked in series. In such cases, provision must be made for balancing and protecting the capacitors as they charge to prevent damage and lifetime degradation due to over voltage.

In the current apparatus disclosed we use the LTC3350, a capacitor charger and storage controller IC designed specifically to address capacitor storage applications. The LTC3350 includes all of the features necessary to provide a complete, standalone storage controller for applications needing capacitor based energy storage. The device can charge, balance and protect a plurality of up to four capacitors in series. Input power fail threshold, capacitor charge voltage and regulated minimum storage voltage can all be programmed with external resistors. In addition, the device contains a very accurate 14-bit internal measurement ADC which monitors input, output and capacitor voltage and current. The internal measurement system also monitors parameters associated with the storage capacitors themselves including capacitor stack voltage, capacitance and stack ESR (Equivalent Series Resistance). All system parameters and fault status that can be read back over a two-wire I2C bus, and alarm levels can be set to alert the operators of the system to a sudden change in any of these measured parameters. The controller integrated circuit controls provides a dependable High Current Super Capacitor Charger and Energy Storage Supply management system. Charging a supercap is similar to charging a battery except for a couple of key points. The first is that a completely discharged capacitor can be charged at full current for the whole charge cycle, whereas a battery needs to be trickle charged until the battery reaches a specified minimum voltage. A second point is that no termination timer is required for capacitors. Once the final "float" voltage is reached, no additional charge can be stored by the capacitor and charging must stop. If two or more super caps are charged in series, any mismatch in capacitance from cell to cell will result different rates of voltage increase across each capacitor as the stack is charged. Additional safety features need to be in place to assure that none of the capacitors exceeds its maximum voltage rating during the charging cycle. In addition, a balancing system must be used to assure that once the stack is charged, all of the cells are forced to the same voltage and do not drift apart over time due to self-discharge differences. Such cell to cell balancing ensures maximum capacitor lifetime. The charging circuitry in the LTC3350 consists of a high current, synchronous buck controller with a resistor programmable max charge current and max stack voltage. Since the charger is powered from the same supply that is powering the load, the LTC3350 also contains a separate programmable input current limit which automatically reduces charge current to the capacitors under heavy VOUT load conditions. Internal, low current balancers force all cells to within 10 mV of each other up to a max voltage of 5V per cell. Internal protection shunts will automatically reduce charging current and shunt the remaining charge current around any capacitor that has reached the 2.7V default or a user-programmed max cell voltage. In addition, the stack charge voltage has the option of being reduced under software control in order to optimize capacitor lifetime for a given storage energy requirement. Once the storage capacitor stack is charged, the system is now able to provide storage power. Charge mode and storage mode are determined by the voltage on the PFI (Power Fail Input) pin. If the VIN voltage drops such that the PFI comparator trips low, the part immediately enters storage mode (see FIG. 3). VOUT will drop as VIN drops, and once the VOUT voltage falls below the capacitor stack voltage, the OUTFET ideal diode conducts to prevent VOUT from falling further. Once VOUT falls to a voltage programmed by a resistor divider on the OUTFB pin, the capacitor charger operates in the opposite direction as a synchronous boost storage DC/DC converter using the VCAP stack as its input source and VOUT as its regulated output. The boost storage converter will continue to run until it can no longer support the VOUT load conditions and the voltage on VOUT falls below the 4.5V UVLO point. This allows virtually all of the usable energy in the supercap stack to be transferred to the load during storage since the boost will continue to run when the stack voltage is well below 4.5V. A typical storage scenario is also shown in FIG. 3. In this example, a stack of four series capacitors is charged to 10V, and during storage mode VOUT is regulated to a minimum of 8V until all energy is depleted from the storage capacitors.

"Health" Monitoring Assures Reliability and Optimizes Performance In high reliability systems requiring short-term storage power, adequate energy must be stored and available in order to perform critical functions immediately following a main power failure. It is essential that the storage energy source is able to deliver the necessary storage power. Super capacitors are an excellent choice for such applications due to their extremely high capacitance per unit volume and very low ESR. However, like batteries, their performance will degrade over time. Capacitor lifetime is commonly (and somewhat arbitrarily) defined as the time required for capacitance to drop by 30% and/or ESR to increase by 100%. As shown in FIG. 4, capacitor degradation is accelerated by either high operating voltages or elevated temperatures. Since both capacitance and capacitor ESR are critical for ensuring that the system can perform a reliable back-up, it is important that the system is able to monitor and report the "health" of the storage capacitors as they age. The LTC3350 automatically monitors both stack capacitance and stack ESR at a time frequency chosen by the user once the capacitor stack is fully charged. The component in the apparatus employs a precision current source, precision timing circuit and its internal 14-bit ADC to accurately monitor the stack capacitance. A precise, programmed current is pulled from the top of capacitor stack while the charger is forced off. The time required for the capacitor stack to drop by 200 mV is precisely measured, and the stack capacitance is calculated from these parameters. Once the capacitance test is completed, the ESR test is done by measuring the stack voltage with and without the high current charger running to re-charge the stack. Using the charger to perform this test eliminates the need for an external high power test load. The instantaneous increase in stack voltage once the charger is enabled corresponds to the measured charge current*stack ESR. The most recent values for capacitance and cap ESR may be read back at any time over I2C.

Once the stack capacitance and ESR values are known, it is straightforward to compute the minimum stack voltage necessary to assure a reliable storage for a given application. Since most storage systems are designed with built-in margin, it is often safe to reduce the stack voltage from its nominal value, thereby maximizing the lifetime of the capacitors. This is easily accomplished through software control of the LTC3350 VCAP feedback DAC voltage. Making effective use of super caps often requires series-connected cells, which in turn require protection and balancing circuits. While the cycle life and lifetime in general of a super capacitor may far exceed that of a competing battery technology, small changes in cap voltage and temperature may lead to dramatic changes in the capabilities of the system over time. For this reason, "health" monitoring is often a required feature in any capacitor-based storage system. This is the exact reason the apparatus presented utilizes the LTC3350 integrated circuit controller, aim to address issues like these that pertain specifically to super capacitor storage applications, and provide the simplest means possible for developing a reliable, flexible, high performance storage solution.

BRIEF DESCRIPTION OF THE DRAWINGS

FIG. 1 Describes structural aspects functions and processes of the Alternative Energy Booster Apparatus Switching System for the individual Shutoff of Cells, the Modifying Polarity and the Switching of Circuits from Parallel to Series Connection with these key functions;

FIG. 1A The function of a plurality of computer controlled switching devices in each cell that can Switch Between a plurality of Rechargeable Storage Devices Super capacitors, Ultra capacitors or batteries.

FIG. 1B The function of a plurality of computer controlled switching devices in each cell that can Switch to Series or Parallel connections of Cells.

FIG. 1C The function where each Switch has the apparatus wiring and logic of a computer controller that can change the Polarity+−Connection of Cell and Storage devices such as batteries to Series or Parallel connections.

FIG. 1D The function where each Switch can Switch Off or Override each cell in Connection and Storage devices such as batteries.

FIG. 1E The function where a programmable controller can utilize the DC Mechanical Switch, Electrode Dipper, and Electrolyte Pump in the apparatus.

FIG. 2 Describes component aspects functions and processes of the Alternative Energy Booster Apparatus Electricity Generation and Energy Storage Capacitor Area with these key functions;

FIG. 2A A component of a Plurality of + or −computer programmable polarity Cell Busbar Connection Circuits with wiring on each side of the cells controlled, and connected to switches.

FIG. 2B The function structural aspect of computer programmable and controlled Switchable Electricity Storage In each individual cell.

FIG. 2C The function where a programmable controller can utilize the DC Mechanical Switch, Electrode Dipper, and Electrolyte Pump in the apparatus.

FIG. 3 Describes structural and component aspects, functions and processes of the Alternative Energy Booster Apparatus Switching System for Shutoff of Cells and Modifying Polarity FIG. 3A Switching System for the individual Shutoff of Cells, the Modifying Polarity and the Switching of Circuits from Parallel to Series Connection with these key functions;

Figures 12A, 12B:
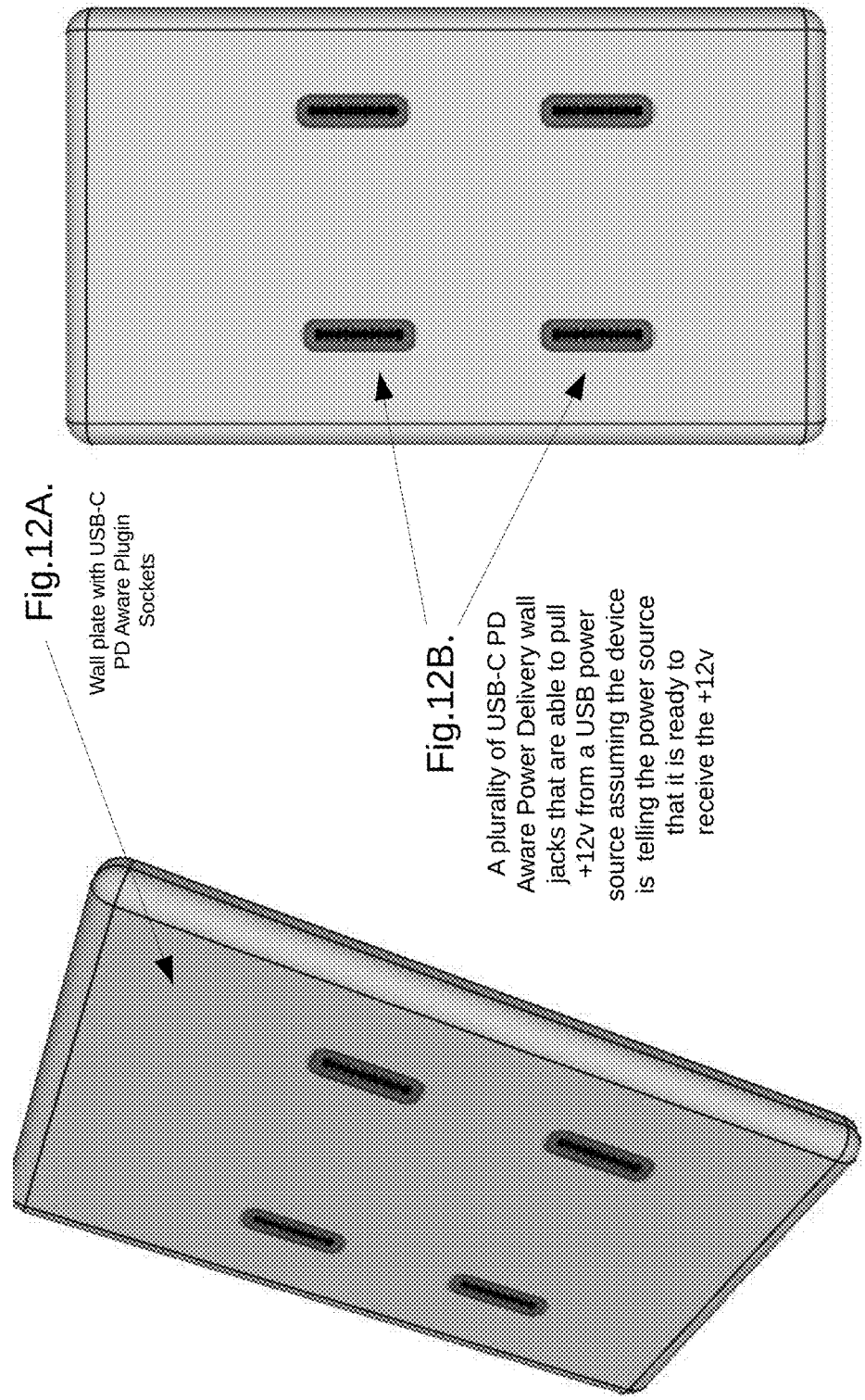

The Function of Electricity Generation in each cell, where the bottom area of the cell generates electricity, and transfers, the energy to the capacitor where it is sent for use.

The Function where the generation apparatus recovers the capacitors provide energy to smooth out the circuit.

The Function available where any time a DC voltage tries to change (big current surge in a chip bringing the levels down momentarily, etc), the capacitor will help oppose that change.

A stabilizing function provided so if any cell fails/malfunctions, or drops below a certain voltage, the capacitors will discharge and maintain the voltage, allowing some time for the Generator to recover.

FIG. 3B The function where a programmable controller can utilize the DC Mechanical Switch, Electrode Dipper, and Electrolyte Pump in the apparatus.

FIG. 4 Describes structural, material and component aspects, functions and processes of the Alternative Energy Booster Apparatus Switching System for the individual Shutoff of Cells, the Modifying Polarity and the Switching of Circuits from Parallel to Series Connection with these key functions and components;

FIG. 4A A plurality of Software Controlled Switching apparatus.

FIG. 4B An Anode, or plurality of Anodes.

FIG. 4C An Electrolyte material consisting of one or more Wet/Dry/Gel electrolytes,/Dry polymer electrolyte,/Solid ceramic electrolyte,/Organic ionic plastic crystals, or $H_2O$.

FIG. 4D A plurality of Electrical Storage devices.

FIG. 4E A Cathode or plurality of Cathodes FIG. 4F The function where a programmable controller can utilize the DC Mechanical Switch, Electrode Dipper, and Electrolyte Pump in the apparatus.

FIG. 5 Describes flow, functions and processes of the Alternative Energy Booster Apparatus Switching System Flow for Shutoff of Cells Rerouting and/or Switching to bring additional Voltage and current into the Circuit with these key functions and components; FIG. 5A-5B Describes flow, functions and processes of the Alternative Energy Booster Apparatus Switching System for the individual Shutoff of Cells, the Modifying Polarity and the Switching of Circuits from Parallel to Series Connection and Voltage drop in Booster Apparatus where the rerouting of electricity can be done, and/or additional energy can be added into the circuit to bring additional Voltage and Current into the Circuit.

FIG. 5C The function where a programmable controller can utilize the DC Mechanical Switch, Electrode Dipper, and Electrolyte Pump in the apparatus.

FIG. 6 Shows diagrams of the Alternative Energy Booster Apparatus Switching System for the individual Shutoff of Cells, the Modifying Polarity and the Switching of Circuits from Parallel to Series Connection and Voltage drop in Booster Apparatus where the rerouting of electricity can be done, and/or additional energy can be added into the circuit to bring additional Voltage and Current into the Circuit.

FIG. 6A-6D shows the process of how a bad cell gets switched off and overridden so as to not create resistance in the circuit. And where a group of cells can be switched from parallel to a series connection when necessary.

FIG. 6E shows the function where a programmable controller can utilize the DC Mechanical Switch, Electrode Dipper, and Electrolyte Pump in the apparatus.

FIG. 7 Shows diagrams of the Alternative Energy Booster Apparatus Case Apparatus Assembly with Cathode and Anode Built into 3D Additive Printed and Manufactured Structure of the Booster Apparatus.

FIG. 7A Describes where an outer coating on outside of case is a patterned Graphene grid creating a Faraday cage built into the case for protection from (EMP) Electro Magnetic Pulse damage FIG. 7B Shows how the top part of the case has a series of Cathodes built in.

FIG. 7C Shows how the bottom part of the case has a series of Anodes built in.

FIG. 7D Shows location and size of the Generator Cells in the case of the apparatus.

FIG. 8 Shows diagrams of the Alternative Energy Booster Apparatus 3D Printed Case with Layers of Materials to Create Anode and Cathode of the Booster Apparatus.

FIG. 8A-8B And further describes the Anode and Cathode apparatus case, where the surfaces of the apparatus are created utilizing additive 3D printing processes, to create conductive surfaces. The purpose of manufacturing in this way, with this method reduces the assembly, and cost of manufacturing the Booster Apparatus.

FIG. 8C And still further describes where a separator goes between the Cathode and Anode, and screws are used to attach Anode to Cathode FIG. 9 Shows diagrams of the Alternative Energy Booster Apparatus Switching System for Shutoff and Programmable Software Controlled Management of Electricity Storage Apparatus and Modifying Polarity FIG. 9A-9D further describes how switching In Electricity Storage batteries, super capacitor, or ultra capacitor can Switch Polarity to Parallel Connection of Electricity Storage, and Switch Polarity to Series Connection of Electricity Storage.

FIG. 9E shows the function where a programmable controller can utilize the DC Mechanical Switch, Electrode Dipper, and Electrolyte Pump in the apparatus.

FIG. 10 Shows diagrams of the Alternative Energy Booster Apparatus Switching System for Shutoff and Programmable Software Controlled Management of Electricity Generation, Use and Storage Apparatus. Where the FIG. 10C programmable controller controls a plurality of these components in FIG. 10A-10F; Programmable Controller; Direct DC Appliance Use; Direct AC Appliance Use; FIG. 10E DC Electricity Storage Batteries, Super Capacitors, Ultra Capacitors; DC Electricity Generation Apparatus, Solar Panel, AC Grid Input/Output; Inverter;

And FIG. 10G-10I where the Alternative Energy Booster Apparatus Controller is programmed to continuously check voltages and currents and directs, switches on and off for the purpose of adding electricity to any device that has a low voltage or current, for the best efficiency and use. Additionally the controller also has a programmable function to change polarity, switch between electricity storage devices, and manage appliance apparatus And further FIG. 10H the Controller has programmable function for adding electricity from generator to the inverter when the grid, solar panels, or generators stop working due to clouds, night time or grid generation failure.

And Still further FIG. 10G the Controller also has a programmable function to be able to reroute appliances to available plurality of electricity generation apparatus and devices. And furthermore has programmable functions to recharge batteries, and redirect available electricity generation to and from the battery or other storage devices. And still further these conversion and switching functions; DC to AC conversion; AC to DC conversion; On Off Switching Programmable Controller; USB-C PD Aware Wall Plate and appliance connectors; Direct DC Appliance Use.

FIG. 11 Shows diagrams of the Alternative Energy Booster Apparatus DC Electricity Generation Apparatus Booster Cell with these components and functions; DC Electricity Generation Apparatus; Layered and Surface Graphene Coated Electrodes;

FIG. 11A Anode Layered Graphene Coated Surface; FIG. 11B Cathode Layered one or a combination of all including; Mg, Aluminum, Copper, or Zinc Coated Surface; FIG. 11C Electrolyte, utilizing one or a combination of all including H20, Gel Polymer; Organic Seaweed, Chlorophyll, Diatomateous Earth, graphite or green plant leaves.

FIG. 12 Shows diagrams of the Alternative Energy Booster Apparatus DC Electricity USB-C PDAware Wall Adaptor apparatus with the following components and functions; FIG. 12A Wall plate with USB-C PD Aware Plugin Sockets FIG. 12B A plurality of USB-C PD Aware Power Delivery wall jacks that are able to pull +12 v from a USB power source assuming the device is telling the power source that it is ready to receive the +12 v FIG. 13 Shows diagrams of the Alternative Energy Booster Apparatus and other DC Electricity Sources for 12 volt or higher DC Electricity transferal to USB-C PDAware Wall Adaptor apparatus with following components and functions; FIG. 13D Wall plate with USB-C PD Aware Plugin Sockets; FIG. 13E Functions for USB-C PDAware Direct DC Appliance Use; FIG. 13B-13C A function where it can be used with DC Electricity Generation Apparatus, Solar Panel, Battery, and other Generation and Storage Devices; FIG. 13A Alternative Energy Booster Apparatus Connected Directly or indirectly through controller to USB-C PDAware Wall Plate.

FIG. 14 Shows diagrams of the Alternative Energy Booster Apparatus and other DC Electricity Sources with the Electrolyte Pumping Apparatus for Plurality of Cells with Electrode Cell Casings, and Programmable Controller for Electrolyte Delivery with these key functions; FIG. 14 A shows where the Electrolyte output tubes used for when old electrolyte is removed from the system. FIG. 14 B shows where the Electrolyte input tubes used for when New electrolyte is injected into the system. FIG. 14C shows +Anode cell casings which are separate cells bottom view FIG. 14D shows the function where a programmable controller can utilize the DC Mechanical Switch, Electrode Dipper, and Electrolyte Pump in the apparatus.

Figures 15A, 15B, 15C:
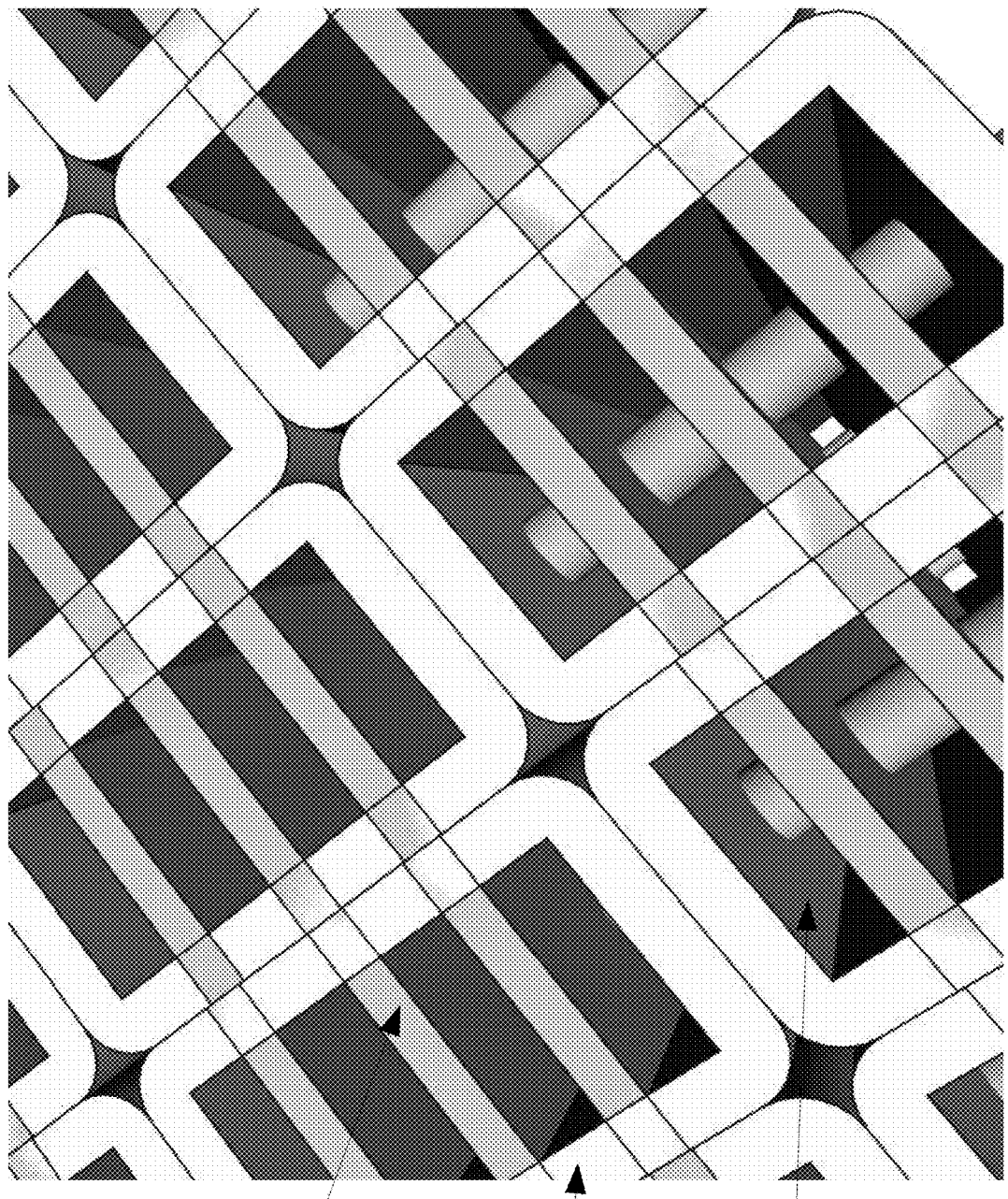

FIG. 15 Shows diagrams of the Alternative Energy Booster Apparatus and other DC Electricity Sources with the Top View of Multiple Cells in Apparatus Showing Electrodes with these key functions; FIG. 15A shows top view of the electrolyte cell container showing the plurality of -Cathodes; FIG. 15B shows top view of the electrolyte cell container showing the +Anode graphene casing;

FIG. 15C shows top view of the electrolyte cell container showing the injection tubes inside the +Anode graphene casing. FIG. 16 Shows diagrams of the Alternative Energy Booster Apparatus and other DC Electricity Sources with the Expanded View of Cell Array of the Apparatus and Functions with these key functions; FIG. 16A Expanded viewpoint of the Alternative Energy Boost cell array input for electrolyte tubing FIG. 16B Showing an array of 16 cells For a potential 32 or more volts, potential energy generation. The cells demonstrate where each cell has 3 cathodes, with one single anode casing for the purpose of extending the useful life of the cell array FIG. 17 Shows diagrams of the Alternative Energy Booster Apparatus and other DC Electricity Sources with the Placement of Input and Output Electrolyte Delivery Apparatus Describing Disbursal and Refurbishment with Pump in System with these key functions; FIG. 17A. Shows electrolyte output tube from top view; FIG. 17B Shows electrolyte input tube from top view; And describes The placement of the input tubes at the top of the cell, provides New Electrolyte disbursal And refurbishment of the electronic cells from the top to the bottom so that the pump can Create suction at the bottom, and pressurized Flow of gel or liquid electrolyte through the top tubes. And also further describes the purpose of the electrolyte injection apparatus Is to keep the electrolyte fresh and at the right density, and in a solid state of gel polymer for maximum energy Creation, Transferal of electrons, and protection of the electrode materials in the presented apparatus. And still further describes where all of these functions with the ability to manage the Pumping and refurbishment of the apparatus cell Remotely utilizing a programmable controller for Electronic management of the mechanism in the Apparatus.

FIG. 17C describes the New Electrolyte storage and pumping apparatus;

FIG. 17D describes the Used Electrolyte storage and pumping apparatus.

FIG. 18 Shows diagrams of the Alternative Energy Booster Apparatus and other DC Electricity Sources with the Sacrificial Electrode Stack with Timer Acrylic Polymer Coating Apparatus with these key functions;

FIG. 18A Shows Non Conductive case cover for all the—cathode Electrodes embedded in Acrylic conductive polymer; FIG. 18B Shows Multiple Plurality Of—cathode electrode connector as one is sacrificed The next one continues to create electrons; FIG. 18C Shows Plurality of—cathode Electrodes spaced apart And embedded in acrylic Polymer that is conductive As a protective barrier to corrosion; FIG. 18D Shows Acrylic polymer timer Barrier between embedded—Cathodes to extend the Life of the cell; FIG. 18E Shows Graphene+Anode;

FIG. 18F Shows Timer acrylic conductive polymer coatings are applied where one coating makes the electrode last for 2 months, and there by applying Multiple coatings Multiplies and extends The life span of the cell in the apparatus here presented. Having a plurality of electrodes provides the benefit to the Alternative Energy Boost Apparatus by utilizing multiple Sacrificial Electrodes, there by providing a longer useful life of the cell, before any regeneration takes place. In the presented Apparatus and System Sacrificial Anodes and Cathodes are used to reduce corrosion of key important electrodes, to extend the life and efficiency of the presented Apparatus.

FIG. 19 Shows diagrams of the Alternative Energy Booster Apparatus and other DC Electricity Sources with the Top View of Cathode Assembly in the Apparatus with Plurality of Cathodes with these key functions; FIG. 19A Shows the Cathode Electrode connector; FIG. 19B Shows Non Conductive Case can be submerged into dry, gel or liquid electrolyte; FIG. 19C Shows A plurality of cathodes embedded in protective coating that dissolves over a period of time, Programmed by the Thickness of the coating; FIG. 19D Shows Acrylic polymer coating that Dissolves over a period of time Delaying the corrosion of the cathodes; FIG. 19E Shows Layered Graphene Anode Creating a larger surface area for storage and transferal of more electrons.

FIG. 20 Shows diagrams of the Alternative Energy Booster Apparatus and other DC Electricity Sources with the Dual Cell Configuration of Low Density and High Density Electrolyte with these key functions;

FIG. 20A Shows Dual Cell With Low density Light Electrolyte for Faster voltage transferal; FIG. 20B Shows Dual Cell With Low density Light Electrolyte for Faster voltage transferal; FIG. 20C Shows Dual Cell With High density Graphene Dark Electrolyte for Greater current Storage and transferal; FIG. 20D Shows 2 Dual Cells With High density Graphene Dark Electrolyte for Greater current Storage and transferal When the light gel electrolyte and dark gel separate cells are connected in parallel configuration, and then connected in series for use, there is greater voltage and current provided to the apparatus in this presented invention.

FIG. 21 Shows diagrams of the Alternative Energy Booster Apparatus and other DC Electricity Sources with the Plurality Layers Alternate Utility Grade Cell in Apparatus with these key functions;

FIG. 21A Shows Cell Case Cover; FIG. 21B Shows Graphene Layered Anode Electrode Connected to Anode Connector; FIG. 21C Shows Anode Connector;

FIG. 21D Shows Graphene Layer Connected to Anode Connector; FIG. 21E Shows Leaf Chlorophyll Cellulose Separator; FIG. 21F Shows Graphene Layer Connected to Anode Connector; FIG. 21G Shows Leaf Chlorophyll Cellulose Separator; FIG. 21H Shows Graphene Layer Connected to Anode Connector;

FIG. 21I Shows Multiple Cathode Connector; FIG. 21J Shows Multiple Cathodes Embedded and encased In timer acrylic polymer Coatings that work with or with out the Switching Dipping Apparatus which increases the voltage, current and the life of The cell in the apparatus; FIG. 21K Shows Multiple cathodes Continually Dipped in and out of the Electrolyte For increased And current Output Up and Down path in and out of the electrolyte; FIG. 21L Shows Electrolyte inside+Anode case where all of the components are submerged partly in electrolyte;

FIG. 22 Shows diagrams of the Alternative Energy Booster Apparatus and other DC Electricity Sources with the Mechanical Generators Alternative Energy Apparatus Boost, Backup, Storage Components with these key functions;

FIG. 22A Shows DC Battery; FIG. 22B Shows Plurality of DC Motors; FIG. 22C Shows DC Motor; FIG. 22D Shows All motors connected together on same shaft So that single DC Motor Can turn all other motors Generating Electricity DC Motor; FIG. 22E Shows DC Motor; FIG. 22F Shows DC Battery to power the main driving motor; FIG. 22G Shows Induction motor, brush less AC motor generating AC Current or synchronized plurality of AC Induction brush less motors; FIG. 22H Shows AC Storage Synchronized with grid, or direct to AC Appliances; FIG. 22I Shows Immediate Use in Boost To Solar Panels at night or Plurality of batteries or super capacitor storage.

FIG. 23 Shows diagrams of the Alternative Energy Booster Apparatus and other DC Electricity Sources with the Electro Mechanical Dipper Switching System for Switching Off and On Electrodes Within Cells in Presented Apparatus with these key functions;

FIG. 23A Shows Electrode—Cathode Electro mechanically dipped in and out of the electrolyte connector; FIG. 23B Shows Plurality of Electrodes—Cathodes Electro mechanically dipped in and out of the electrolyte connector; FIG. 23C Shows Apparatus Casing Battery Super Capacitor; FIG. 23D Shows Low energy DC Motor Speed Managed By programmable controller; FIG. 23E Shows Gel polymer Electrolyte; FIG. 23F Shows the function where a programmable controller can utilize the DC Mechanical Switch, Electrode Dipper, and Electrolyte Pump in the apparatus; FIG. 23G Shows Cell Casing+Anode Electrode.

FIG. 24 Shows diagrams of the Alternative Energy Booster Apparatus and other DC Electricity Sources with the Sacrificial Anode Cathode Layered Timer Electrodes with these key functions;

FIG. 24A Shows End of cell with Plurality of sacrificial cathodes And single outside Of cell connector; FIG. 24B Shows Cell top connector Plurality of sacrificial Cathodes for Connecting Multiple cells in parallel or series configurations; FIG. 24C Shows Multiple cathodes Embedded in timer Coatings, sacrificial One at a time For extended life Of the cell apparatus.

FIG. 25 Shows diagrams of the Alternative Energy Booster Apparatus and other DC Electricity Sources with the Electro Mechanical Dipper Switching System for Switching Off and On Cells in Apparatus with these key functions;

FIG. 25A Shows Connector Rods to Plurality of—Cathodes In Apparatus cells; FIG. 25B Shows Low voltage DC Motors Controlled by programmable; FIG. 25C Shows Line shows that a plurality of cells can be Linked together in Parallel and series; FIG. 25D Shows Low voltage DC Motor; FIG. 25E Shows Motor shaft that Stays in center; FIG. 25F Shows Casing has rechargeable Batteries, and super capacitors For backup, storage and night time use; FIG. 25G Shows Wheel lifters Mechanically Adjusted for proper Dipping and lifting; FIG. 25H Shows Wheel lifters have adjustable off center shaft holes; FIG. 25I Shows the function where a programmable controller can utilize the DC Mechanical Switch, Electrode Dipper, and Electrolyte Pump in the apparatus.

FIG. 26 Shows diagrams of the Alternative Energy Booster Apparatus and other DC Electricity Sources with the Electro Mechanical Dipping Switching System for Switching Off and On Cells in Apparatus with these key functions;

FIG. 26A Shows Base of Apparatus Cell area is used For battery storage, Super capacitor storage, And gel polymer used Or new for refurbishing The electrolyte in the presented apparatus; FIG. 26B Shows the function where a programmable controller can utilize the DC Mechanical Switch, Electrode Dipper, and Electrolyte Pump in the apparatus.

FIG. 27 Shows diagrams of the Alternative Energy Booster Apparatus and other DC Electricity Sources with the Wireless Electrical Transferal Component of the Apparatus with these key functions;

FIG. 27A Shows Programmable Electronic controller; FIG. 27B Shows Electricity source to be transmitted; FIG. 27C Shows Multiple low Energy lasers;

FIG. 27D Shows Photo Voltaic Cell receiver; FIG. 27E Shows programmable electronic Controller; FIG. 27F Shows Wall Panel Jack for use in appliances;

FIG. 27G Shows Battery or Super Capacitors for storage; FIG. 27H Shows Appliances for use; FIG. 27I Shows mechanical generator for creating more electricity.

FIG. 28 Shows diagrams of the Alternative Energy Booster Apparatus and other DC Electricity Sources with the Mobile Phone Payment System Connected to mechanically and electronically Shutting off of Cells, Modifying Polarity and reducing energy output of the Solar Panel Boost Apparatus with these key functions;

FIG. 28A Shows Mobile Phone Connected to the Internet; FIG. 28B Shows Solar Panel (Alternative Energy) Boost Apparatus; FIG. 28C Shows Mechanical Electrode Switching; FIG. 28D Shows Electronic Electrode Switching;

FIG. 28E Shows Electronic controller; FIG. 28F Shows Solar panel Electricity Generation; FIG. 28G Shows Magnetic motor electricity generation; FIG. 28H Shows Wireless Laser Electricity transferal; FIG. 28I Shows Super Capacitor storage; FIG. 28J Shows battery storage; FIG. 28K Shows Mechanical Generators alternative energy apparatus components; FIG. 28L Shows Wireless Electrical transferal apparatus; FIG. 28M Shows switching apparatus used for payments;

FIG. 28N Shows dipping switching apparatus used in payments and the function where a programmable controller can utilize the DC Mechanical Switch, Electrode Dipper, and Electrolyte Pump in the apparatus to control payments.

FIG. 29 Shows diagrams of the Alternative Energy Booster Apparatus and other DC Electricity Sources with the Switching System for Shutoff of Cells and Modifying Polarity and Backing up Electricity, Storage of Electricity and Night Time Use Of Electricity with these key functions;

FIG. 29A Shows Programmable Controller manages the LTC3350 Backup And storage apparatus Component in the Apparatus presented; FIG. 29B Shows the function where a programmable controller can utilize the DC Mechanical Switch, Electrode Dipper, and Electrolyte Pump in the apparatus; FIG. 29C shows where Super Capacitors can be connected at this component area to a Programmable Blockchain as an additional Security or Payment Apparatus in the apparatus presented.

FIG. 30 Shows diagrams of the Alternative Energy Booster Apparatus and other DC Electricity Sources with the Switching System for Shutoff of Cells and Modifying Polarity and Backing up Electricity, Storage of Electricity and Night Time Use Of Electricity with these key functions;

FIG. 30A Shows Programmable Controller manages the LTC3350 Backup And storage apparatus Component in the Apparatus presented; FIG. 30B Shows the function where a programmable controller can utilize the DC Mechanical Switch, Electrode Dipper, and Electrolyte Pump in the apparatus; FIG. 30C shows where Super Capacitors can be connected at this component area to a Programmable Blockchain as an additional Security or Payment Apparatus in the apparatus presented.

FIG. 31 Shows diagrams of the Alternative Energy Booster Apparatus and other DC Electricity Sources with the Low Cost 4 Cell Switching System 6 to 8 volts with Autonomous Layered Cathode Apparatus with these key functions;

FIG. 31A Shows Spring Loaded Layered Cathode Applying pressure into the electrolyte gel polymer; FIG. 31B Shows Multiple Electrodes Coated in timer polymer When degraded new electrode material Is pushed down into the Electrolyte For continuous electricity generation; FIG. 31C Shows Cover for the 4 cell array And the cathodes under spring pressure; FIG. 31D Shows Electrolyte+anode Casing with insulated step to apply pressure to cathode; FIG. 31E Shows Insulated bottom casing; FIG. 31F Shows Measurement of ½ inch Square cell size with 10,000 cell capacity In 24 inches by 48 inch by 1 inch high space.

FIG. 32 Shows diagrams of the Alternative Energy Booster Apparatus and other DC Electricity Sources with the Potential Energy Switching System for the Capture of Maximum Energy in Apparatus FIG. 32A Shows Graph showing the initial 3 to 5 second pulse of energy created by The apparatus cell structure; FIG. 32B Shows Graph showing the settle down Energy equilibrium in the apparatus Cell structure; FIG. 32C Shows The dipping switching apparatus Which is a core component of The presented apparatus captures The first 2 to 5 seconds of energy And stores it in super capacitors, Storage devices, utilizes it Continually 24 hours a day, and increases the lifespan, and energy In the presented apparatus; and further shows where the FIG. 32D Shows Voltage meter readings of the presented alternative energy apparatus cells showing where the cell in the first 3 to 5 seconds has a higher energy potential.

DETAILED DESCRIPTION

The Alternative Energy Booster Apparatus disclosed has cells built in that have the ability to generate electricity, store electricity, and deliver electricity to inverters, batteries, capacitors, users, the grid and directly or indirectly to useful appliances.

A preferred embodiment of the invention is that the Alternative Energy Booster Apparatus is made of organic materials, that are inexpensive to apply, with 3D printing, and the apparatus has a very light weight for it's energy density.

Electronic and Mechanical Switching apparatus are included for the purpose of increasing efficiency of the apparatus in creating, transferring and storing electricity.

A wall plate that is a core component of the invention works with the Alternative Energy Booster Apparatus providing a 12 volt DC electricity to appliances, and devices inside a living or working space.

Another aspect of the Alternative Energy Booster Apparatus invention consists of cells in which are a pair of electrodes, one of which is magnesium, covered with layers of graphene and polymers and an electrolyte composed of $H_2O$ in a gel electrolyte combined with graphene electrode protected by layers of material which protects it to a great degree from the action of the electrolyte solution.

In still another detail of the invention is where an electric cell or battery is electrically combined with a capacitor in each cell, so the capacitor can serve as a buffer for the cell or battery. One object of this invention, therefore, is to provide an electric cell, or battery, with a closely coupled capacitor, to serve as a buffer for the cell or battery, and to provide the energy of the cell, or the battery. This invention relates to a combination solid state battery and capacitor device to serve as a direct current external utilization circuit, with a reduced or eliminated outside energy source.

In still a further detail of the invention is related to the Alternative Energy Boost apparatus was to create an inexpensive, easily manufactured energy cell apparatus, from abundant readily available organic materials for the purpose of energy creation for the 1.2 billion people that have never had electricity. A proprietary apparatus, for utilizing additive printing methods to easily manufacture cells, and for creating Multi-Wall carbon nano tubes suspended over multiple graphitic ground electrodes in a gel polymer. The cell apparatus involves combining graphene and other materials in a Van der Waals heterostructure (vdWh) to generate an electric gate control of the spin current and spin lifetime at room temperature, as well as extreme hot and cold temperatures. In the alternative energy boost cells, We are using our proprietary additive manufacturing methods for the purpose of creating electron flow in materials by regulating the spin-polarized electron injection with proprietary spin logic devices for spin injection to graphene to create electron flow, with the least amount of degradation of the metalic electrodes in the apparatus.

An extremely important class of oxidation and reduction reactions are used to provide useful potential electrical energy in energy production and storage. A simple organic electrochemical cell combined with unique switching components is utilized from 2 complex layered materials components A & B. In the process of the reaction, electrons are transferred from the Anode to Cathode through an electrically conducting path as a useful electric current. An electrochemical cell is created by placing proprietary special multi-layered material electrodes into an organic gel electrolyte where a chemical reaction generates an electric current. Modules made up of these Voltaic cells generate a consistent electric current that regenerates itself, and the voltage and current dependent upon switching motive apparatus. The Alternative Energy Boost Voltaic Cells are an electrochemical cell which causes external electric current flow using a plurality of specific layered different metals combined with organic materials that differ in their tendency to lose electrons. One material A more readily loses electrons than the other material B, so by placing material component A and material component B in gel electrolyte solutions electrons begin to flow through an external high conductance material which leads from the material A to the material B. As a material A atom provides the electrons, it becomes a positive ion and goes into organic gel electrolyte solution, decreasing the mass of the material A electrode. The Alternative Energy Boost cell technology has special apparatus that dramatically decrease the amount of mass oxidized for the longevity of the cell. On the material B side, the two electrons received allow it to convert a material B ion from solution into an uncharged material B atom which has the unique function of having absolutely no deposits over time on the material B electrode, increasing its mass. Alternative Energy Boost cell technology has a special layering apparatus and manufacturing apparatus technique that dramatically decrease the reduction causing build up of material B electrode for longevity of the cell. Included in each Alternative Energy Boost cell also are energy storage organic plant based multi layered, components from the electrostatic energy domain, sealed in aerobic condition, that raise and stabilize the voltage and current dramatically. There are additional electrons added to the Alternative Energy Boost cell system from these dry materials, dependent on the layering array. Clearly, to get energy from the Alternative Energy Boost cell, you must get more energy released from the oxidation of the material A than it takes to reduce the material B. The cell can yield a finite amount of energy from this process, regulated by the proprietary manufacturing apparatus, and a plurality of cells combined can yield a high amount of energy from this process, only limited by the amount of organic material available regenerated, or replaced, combined with the configuration of the spin transistor, and the spin logic applied to the system, in the combined organic material A & B electrodes.

In another aspect of the presented apparatus a magnesium layered cathode protects a graphene layered anode, and multiple magnesium cathodes are sacrificed and switched on or off utilizing electronic, mechanical and special coating materials to extend the lifespan.

Glossary of Terms

Solid Electrolytes can be Mostly Divided into Four Groups:
Gel electrolytes—closely resemble liquid electrolytes. In essence, they are liquids in a flexible lattice framework. Various additives are often applied to increase the conductivity of such systems.

Dry polymer electrolytes—differ from liquid and gel electrolytes in the sense that salt is dissolved directly into the solid medium. Usually it is a relatively high dielectric constant polymer (PEO, PMMA, PAN, polyphosphazenes, siloxanes, etc.) and a salt with low lattice energy. In order to increase the mechanical strength and conductivity of such electrolytes, very often composites are used, and inert ceramic phase is introduced. There are two major classes of such electrolytes: polymer-in-ceramic, and ceramic-in-polymer.

Solid ceramic electrolytes—ions migrate through the ceramic phase by means of vacancies or interstitials within the lattice. There are also glassy-ceramic electrolytes.

Organic ionic plastic crystals—are a type organic salts exhibiting mesophases (i.e. a state of matter intermediate between liquid and solid), in which mobile ions are orientationally or rotationally disordered while their centers are located at the ordered sites in the crystal structure. They have various forms of disorder due to one or more solid-solid phase transitions below the melting point and have therefore plastic properties and good mechanical flexibility as well as improved electrodelelectrolyte interfacial contact. In particular, protic organic ionic plastic crystals (POIPCs), which are solid protic organic salts formed by proton transfer from a Brønsted acid to a Brønsted base and in essence are protic ionic liquids in the molten state, have found to be promising solid-state proton conductors for fuel cells. Examples include 1,2,4-triazolium perfluorobutanesulfonate and imidazolium methanesulfonate.

AQUEOUS of or containing water

ACTUATOR—In electrical engineering, the term actuator refers to a mechanism that causes a device to be turned on or off, adjusted or moved, usually in response to an electrical signal. In some literature the terms actor or effector are also used. The term "effector" is preferred by programmers, whereas engineers tend to favor "actuator." An example of an actuator is a motor that closes blinds in response to a signal from a sunlight detector. Actuators enable computers to control complex manufacturing processes without human intervention or supervision.

In an embodiment of the Alternative Energy Booster Apparatus disclosed here a Digital Actuator is being used to control temperatures within the apparatus by turning on and off override switches around individual cells. An Actuator is also used to control the speed of the on/off output energy of each individual cell for the purpose of greater energy output and creation.

ACTUATOR SOLENOID—The solenoid in the actuator housing on the back of the injection pump which moves the control rack as commanded by the engine controller.

ALTERNATING CURRENT (AC)—A flow of electrons which reverses its direction of flow at regular intervals in a conductor.

BUSBAR:
An electrical conductor that makes a common connection between several circuits. Sometimes, electrical wire cannot accommodate high-current applications, and electricity must be conducted using a more substantial busbar—a thick bar of solid metal (usually copper or aluminum). Busbars are uninsulated, but are physically supported by insulators. They are used in electrical substations to connect incoming and outgoing transmission lines and transformers; in a power plant to connect the generator and the main transformers; in industry, to feed large amounts of electricity to equipment used in the aluminum smelting process, for example, or to distribute electricity in large buildings CAPACITOR—A device which stores electrical energy. Commonly used for filtering out voltage spikes.

CHARGE—To restore the active materials in a storage battery by the passage of direct current through the battery cells in a direction opposite that of the discharging current.

CURRENT—Movement of electricity along a conductor. Current is measured in amperes.

CURRENT FLOW—The flow or movement of electrons from atom to atom in a conductor.

CYCLE—The change in an alternating electrical sine wave from zero to a positive peak to zero to a negative peak and back to zero.

CYCLING—The process by which a battery is discharged and recharged.

DIAGNOSTIC CODE—A number which represents a problem detected by the engine controller. Diagnostic codes are transmitted for use by on-board displays or a diagnostic reader so the operator or technician is aware there is a problem and in what part of the fuel injection system the problem can be found.

DIFFERENTIATOR CIRCUIT—A circuit that consists of resistors and capacitors designed to change a DC input to an AC output. It is used to make narrow pulse generators and to trigger digital logic circuits. When used in integrated circuits it is known as an inverter.

DIGITAL IC—Integrated circuits that produce logic voltage signals or pulses that have only two levels of output that are either ON or OFF (yes or no). Some component output examples are: Diagnostic Codes Output, Pulse-Width-Modulated (PWM) Throttle Output, Auxiliary Speed Output, and Fuel Flow f Throttle Output.

DIODE—An electrical device that will allow current to pass through itself in one direction only.

DIRECT CURRENT (DC)—A steady flow of electrons moving steadily and continually in the same direction along a conductor from a point of high potential to one of lower potential. It is produced by a battery, generator, or rectifier.

DISCHARGE—To remove electrical energy from a charged body such as a capacitor or battery.

ELECTRICITY—The flow of electrons from atom to atom in a conductor.

ELECTROCHEMICAL—The relationship of electricity to chemical changes and with the conversions of chemical and electrical energy. A battery is an electrochemical device.

ELECTROLYTE—Any substance which, in solution, is dissociated into ions and is thus made capable of conducting an electrical current. The sulfuric acid-water solution in a storage battery is an electrolyte.

ELECTRONIC CONTROL UNIT (ECU)—General term for any electronic controller. See "controller:'

ELECTRONIC GOVERNOR—The computer program within the engine controller which determines the commanded fuel delivery based on throttle command, engine speed, and fuel temperature. It replaces the function of a mechanical governor.

FIELD EFFECT TRANSISTOR (FET)—A transistor which uses voltage to control the flow of current. Connections are the source (input), drain (output) and gate (control).

FIXED RESISTOR—A resistor which has only one resistance value.

FUSE—A replaceable safety device for an electrical circuit. A fuse consists of a fine wire or a thin metal strip encased in glass or some fire resistant material. When an overload occurs in the circuit, the wire or metal strip melts, breaking the circuit.

GATE—A logic circuit device which makes a YES or NO (one or zero) decision (output) based on two or more inputs.

GENERATOR—A device which converts mechanical energy into electrical energy.

GRID—A wire mesh to which the active materials of a storage battery are attached.

GROUND—A ground occurs when any part of a wiring circuit unintentionally touches a metallic part of the machine frame.

GROUNDED CIRCUIT—A connection of any electrical unit to the frame, engine, or any part of the tractor or machine, completing the electrical circuit to its source.

GROWLER—A device for testing the armature of a generator or motor.

HYDROMETER—An instrument for measuring specific gravity. A hydrometer is used to test the specific gravity of the electrolyte in a battery.

IGNITION CONTROL UN IT—The module that contains the transistors and resistors that controls the electronic ignition.

INDUCTANCE—The property of an electric circuit by which an electromotive force (voltage) is induced in it by a variation of current either in the circuit itself or in a neighboring circuit.

INDUCTOR—A coil of wire wrapped around an iron core.

INSULATED GATE FIELD EFFECT TRANSISTOR (IGFET)—A diffused transistor which has an insulated gate and almost infinite gate—channel resistance.

INSULATOR—A substance or body that resists the flow of electrical current through it. Also see "Conductor:'

INTEGRATED CIRCUIT (IC)—An electronic circuit which utilizes resistors, capacitors, diodes, and transistors to perform various types of operations. The two major types are Analog and Digital Integrated Circuits.

INTEGRATOR CIRCUIT—A circuit that consists of resistors and capacitors and functions as a filter which can pass signals only below a certain frequency.

INVERTER—A device with only one input and one output; it inverts or reverses any input.

ION—An atom having either a shortage or excess of electrons.

ISOLATION DIODE—A diode placed between the battery and the alternator. It blocks any current flow from the battery back through the alternator regulator when the alternator is not operating.

LIGHT EMITTING DIODE (LED)—A solid-state display device that emits infrared light when a forward-biased current flows through it.

LINES OF FORCE—Invisible lines which conveniently illustrate the characteristics of a magnetic field and magnetic flux about a magnet.

LIQUID CRYSTAL DISPLAY (LCD)—A display device utilizing a special crystal fluid to allow segmented displays.

MICROPROCESSOR—An integrated circuit combing logic, amplification and memory functions.

MICROSCOPIC LEAF WETNESS (MLW) describes where minute amounts of persistent liquid water is created in nature and all plant surfaces on leaf surfaces which are invisible to the naked eye. The water is mainly maintained by transpired water vapor condensing onto the leaf surface and to attached leaf surface particles. With an estimated average thickness of less than 1 µm, microscopic leaf wetness.

The MLW is used in the presented apparatus as a microscopic separation film for the purpose of increasing electron flow, and protecting Cathodic electrodes.

MULTIMETER—A testing device that can be set to read ohms (resistance), voltage (force), or amperes (current) of a circuit.

MUTUAL INDUCTION—Occurs when changing current in one coil induces voltage in a second coil.

NEGATIVE—Designating or pertaining to a kind of electricity. Specifically, an atom that gains negative electrons is negatively charged.

NORMALLY OPEN and NORMALLY CLOSED—These terms refer to the position taken by the contacts in a magnetically operated switching device, such as a relay, when the operating magnet is de. energized.

OHM—The standard unit for measuring resistance to flow of an electrical current. Every electrical conductor offers resistance to the flow of current, just as a tube through which water flows offers resistance to the current of water. One ohm is the amount of resistance that limits current flow to one ampere in a circuit with one volt of electrical pressure.

OHMMETER—An instrument for measuring the resistance in ohms of an electrical circuit.

OHM'S LAW—Ohm's Law states that when an electric current is flowing through a conductor, such as a wire, the intensity of the current (in amperes) equals the electromotive force (volts) driving it, divided by the resistance of the conductor. The flow is in proportion to the electromotive force, or voltage, as long as the resistance remains the same.

OPEN OR OPEN CIRCUIT—An open or open circuit occurs when a circuit is broken, such as by a broken wire or open switch, interrupting the flow of current through the circuit. It is analogous to a closed valve in a water system.

OPERATIONAL AMPLIFIER—A high-voltage gain, low-power, linear amplifying circuit device used to add, subtract, average, etc.

OVERRUNNING CLUTCH—One type of fly wheel engaging member in a starting motor.

PARALLEL CIRCUIT—A circuit in which the circuit components are arranged in branches so that there is a separate path to each unit along which electrical current can flow.

PERMANENT MAGNET—A magnet which retains its property of magnetism for an indefinite period.

PIEZO ELECTRIC DEVICE—A device made of crystalline materials, such as quartz, which bend or distort when force or pressure is exerted on them. This pressure forces the electrons to move.

PLATE—A solid substance from which electrons flow. Batteries have positive plates and negative plates.

POLARITY—A collective term applied to the positive (+) and negative (−) ends of a magnet or electrical mechanism such as a coil or battery.

POLE—One or two points of a magnet at which its magnetic attraction is concentrated.

POLE SHOES—Iron blocks fastened to the inside of a generator or motor housing around which the field or stator coils are wound. The pole shoes may be permanent or electro-magnets.

POSITIVE—Designating or pertaining to a kind of electricity. Specifically, an atom which loses negative electrons and is positively charged.

POTENTIAL—Latent qualities or abilities that may be developed and lead to future success or usefulness. The quantity determining the energy of mass in a gravitational field or of charge in an electric field.

POTENTIAL ENERGY—The energy possessed by a body by virtue of its position relative to others, stresses within itself, electric charge, and other factors.

POTENTIAL ENERGY CAPTURE AND USE—The capturing of the greatest or lowest quantity of energy at a specific time and space for the purpose of a particular use in the system managed by an electronic or mechanical programming controller. In the current presented invention an Electronic Mechanical Dipping Switch apparatus is used to capture the highest moment, voltage and current of potential energy.

When measured with a meter a common standard Battery goes right to the settled voltage 1.5 volts. Where in the presented invention when the Alternative Energy Boost cell is measured it goes first to 2 volts or as much as double the voltage for a period of time then drops to 1.5 volts each time the switch is turned on in the system. The presented invention utilizes the switching apparatus to stabilize the highest potential pulses of energy.

POTENTIOMETER—A variable resistor used as a voltage divider.

POWER SWITCH TRANSISTOR—The part responsible for switching off the primary circuit that causes high voltage induction in the secondary winding in an electronic ignition system.

PRIMARY SPEED SENSOR—An engine speed sensor located inside the actuator housing on the back of the injection pump.

PRINCIPLE OF TURNING FORCE—Explains how magnetic force acts on a current—carrying conductor to create movement of an armature, such as in an electric motor.

PRINTED CIRCUIT BOARD—A device used to hold integrated circuit components in place and provide current paths from component to component. Copper pathways are etched into the board with acid.

PROTON—A particle which, together with the neutron constitutes the nucleus of an atom. It exhibits a positive charge of electricity.

PULSE—A signal that is produced by a sudden ON and OFF of direct current (DC) within a circuit.

PULSE-WIDTH-MODULATED (PWM)—A digital electronic signal which consists of a pulse generated at a fixed frequency. The information transmitted by the signal is contained in the width of the pulse. The width of the pulse is changed (modulated) to indicate a corresponding change in the information being transmitted, such as throttle command.

RECTIFIER—A device (such as a vacuum tube, commutator, or diode) that converts alternating current into direct current.

REGULATOR—A device which controls the flow of current or voltage in a circuit to a certain desired level.

RELAY—An electrical coil switch that uses a small current to control a much larger current.

RELUCTANCE—The resistance that a magnetic circuit offers to lines of force in a magnetic field.

RELUCTOR—A metal cylinder, with teeth or legs, mounted on the distributor shaft in an electronic ignition system. The reluctor rotates with the distributor shaft and passes through the electromagnetic field of the sensor.

RESISTANCE—The opposing or retarding force offered by a circuit or component of a circuit to the passage of electrical current through it. Resistance is measured in ohms.

RESISTOR—A device usually made of wire or carbon which presents a resistance to current flow.

RHEOSTAT—A resistor used for regulating a current by means of variable resistance; rheostats allow only one current path.

RIGHT-HAND RULE—A method used to determine the direction a magnetic field rotates about a conductor, or to find the north pole of a magnetic field in a coil.

ROTOR—The rotating part of an electrical machine such as a generator, motor, or alternator.

SACRIFICIAL ANODE—Are easily corroded materials deliberately installed in a pipe or tank to be sacrificed to corrosion, leaving the rest of the system relatively corrosion free.

The mechanism of the sacrificial anode protection system is very similar to the reaction mechanism of electrochemical cells. In sacrificial anodes the protected metal is placed on the cathode side and then a more reactive metal or alloy (having a larger potential difference than the protected metal) is chosen and connected to the protected metal as an anode. The redox reaction will proceed spontaneously. An oxidation reaction occurs at the anode, which means that the sacrificial metal will be consumed. At the same time, the reduction reaction occurs on the cathodic side, preventing the protected metal from erosion. Thus, corrosion on the protected metal is successfully shifted to the anode, protecting the metal.

SACRIFICIAL CATHODE—in the presented alternative energy boost apparatus there is included not just sacrificial anodes, but sacrificial cathodes, that have timer acrylic polymer coatings as well as non coated metals used to increase the lifespan of the electrodes, and reduce the corrosion of critical electrodes in the apparatus system presented here.

In the presented apparatus the magnesium cathode protects the graphene anode, and multiple magnesium cathodes are sacrificed to extend the lifespan of the apparatus.

SELF-INDUCTION—Voltage which occurs in a coil when there is a change of current.

SEMICONDUCTOR—An element which has four electrons in the outer ring of its atoms. Silicon and germanium are examples. These elements are neither good conductors nor good insulators. Semiconductors are used to make diodes, transistors, and integrated circuits.

SENDING UNIT—A device, usually located in some part of an engine, to transmit information to a gauge on an instrument panel.

SENSOR—A small coil of fine wire in the distributor on electronic ignition systems. The sensor develops an electromagnetic field that is sensitive to the presence of metal. In monitors and controllers, they sense operations of machines and relay the information to a console.

SEPARATOR—Any of several substances used to keep one substance from another. In batteries a separator separates the positive plates from the negative plates.

SERIES CIRCUIT—A circuit in which the parts are connected end to end, positive pole to negative pole, so that only one path is provided for current flow.

SERIES-PARALLEL CIRCUIT—A circuit in which some of the circuit components are connected in series and others are connected in parallel.

SHORT (OR SHORT CIRCUIT)—This occurs when one part of a circuit comes in contact with another part of the same circuit, diverting the flow of current from its desired path.

SHUNT—A conductor joining two points in a circuit so as to form a parallel circuit through which a portion of the current may pass.

SLIP RING—In a generator, motor, or alternator, one of two or more continuous conducting rings from which brushes take, or deliver to, current.

SOLENOID—A tubular coil used for producing a magnetic field. A solenoid usually performs some type of mechanical work.

SOLID-STATE CIRCUITS—Electronic (integrated) circuits which utilize semiconductor devices such as transistors, diodes and silicon controlled rectifiers.

SPARK PLUGS—Devices which ignite the fuel by a spark in a spark-ignition engine.

SPECIFIC GRAVITY—The ratio of a weight of any volume of a substance to the weight of an equal volume of some substance taken as a standard, usually water for solids and liquids. When a battery electrolyte is tested the result is the specific gravity of the electrolyte.

SPIN TRANSISTOR electrically controlled persistent spin polarization with unprecedented long lifetime enable a rechargeable spin battery that runs after the electricity is switched off.

SPRAG CLUTCH DRIVE—A type of flywheel engaging device for a starting motor.

STATOR—The stationary part of an alternator in which another part (the rotor) revolves.

STORAGE BATTERY—A group of electrochemical cells connected together to generate electrical energy. It stores the energy in a chemical form.

SULFATION—The formation of hard crystals of lead sulfate on battery plates. The battery is then "sulfated."

SWITCH—A device which opens or closes electrical pathways in an electrical circuit.

SYNCHROGRAPH—An all-purpose distributor tester.

TACHOMETER—An instrument for measuring rotary speed; usually revolutions per minute.

TEFLON MOLD—A Teflon mold for making non stick layers of Graphene and Aqueous Gel Acrylic Polymer for increasing the lifespan of the Anode electrode in the disclosed invention.

TEMPORARY MAGNET—A magnet which loses its property of magnetism quickly unless forces act to re-magnetize it.

THERMISTOR—A temperature-compensated resistor. The degree of its resistance varies with the temperature. In some regulators, it controls a Zener diode so that a higher system voltage is produced in cold weather, when needed.

TRANSFORMER—A device made of two coil windings that transfers voltage from one coil to the next through electromagnetic induction. Depending upon the number of windings per coil, a transformer can be designed to step-up or step-down its output voltage from its input voltage. Transformers can only function with alternating current (AC).

TRANSIENT VOLTAGE PROTECTION MODULE (TVP)—A device which protects the engine controller electronics against high energy voltage transients such as alternator load dumps.

TRANSISTOR—A device constructed of semi-conductors that is used in circuits to control a larger current by using a smaller current for operation. Its function is the same as a relay.

TRIMMER RESISTOR—A resistor used in applications where only a small resistance change is needed.

VACUUM FLORESCENT DISPLAY (VDC)—An anode-controlled display which emits its own light. It works like a television tube, directing streams of electrons to strike phosphorescent segments.

VAN DER WAALS ATTRACTION An electrostatic attraction between opposite charges. Van der Waals forces' is a general term used to define the attraction of intermolecular forces between molecules. There are two kinds of Van der Waals forces: weak London Dispersion Forces and stronger dipole-dipole forces.

In the presented apparatus a plurality of metal cells electrodes are coated to create Dipole-dipole attraction forces for the purpose of reducing corrosion, and increasing electricity generation. Van der Waals dipole-dipole forces are attractive forces between the positive end of one polar molecule and the negative end of another polar molecule. Dipole-dipole forces have strengths that range from 5 kJ to 20 kJ per mole . . . . The partially positive end of a polar molecule is attracted to the partially negative end of another.

VARIABLE RESISTOR—A resistor that can be adjusted to different ranges of value.

VISCOSITY—The internal resistance of a fluid, caused by molecular attraction, which makes it resist a tendency to flow.

VOLT—A unit of electrical pressure (or electromotive force) which causes current to flow in a circuit. One volt is the amount of pressure required to cause one ampere of current to flow against one ohm of resistance.

VOLTAGE—That force which is generated to cause current to flow in an electrical circuit. It is also referred to as electromotive force or electrical potential. Voltage is measured in volts.

VOLTAGE REGULATOR—A device that controls the strength of a magnetic field produced by a generator or alternator. It prevents the battery from being over or undercharged during high- or low-speed operation of the generator or alternator.

VOLTMETER—An instrument for measuring the force in volts of an electrical current. This is the difference of potential (voltage) between different points in an electrical circuit. Voltmeters are connected across (parallel to) the points where voltage is to be measured.

WATT—A unit of measure for indicating the electrical power applied in a circuit. It is obtained by multiplying the current (in amperes) by the electrical pressure (in volts) which cause it to flow. That is: watts=amperes×volts.

WATT-HOUR—A unit of electrical energy. It indicates the amount of work done in an hour by a circuit at a steady rate of one watt. That is, watt hours=ampere–hours×volts.

WAVE—A signal that is produced by varying a continuous flow of current within a circuit. Waveforms can be created by either AC or DC current.

WAVEFORM—A graphical representation of electrical cycles which shows the amount of variation in amplitude over some period of time.

WINDING—The coiling of a wire about itself or about some object. Often identified as a series winding, a shunt winding, etc.

WIRING HARNESS—The trunk and branches which feed an electrical circuit. Wires from one part of the circuit enter the trunk, joining other wires, and then emerge at another point in the circuit.

ZENER DIODE—A semiconductor device that will conduct current in the reverse direction when the voltage becomes higher than a predetermined voltage.

The invention claimed is:

1. An Alternative Energy Booster Apparatus that comprises the following components, materials and layered assemblies;

A plurality of electricity generation cells, wherein electricity can be generated;

and further comprising connections to a plurality of switching controllers, wherein the electricity can be switched on and off and between cells;

and further comprising connections to a plurality of electricity storage capacitors, and/or batteries, wherein current can be stored further comprising;

and further comprising connections to a plurality of aqueous delivery points to cells, wherein conductive and non conductive materials can be transported;

and further comprising connections to a plurality of layered Anode components, wherein coatings are applied for timing purposes;

and further comprising the use of a plurality of layered Cathode components, wherein coatings are applied for timing purposes;

and further comprising the use of a plurality of DC Electricity Generation Apparatus, wherein additional electricity can be generated in the apparatus;

and further comprising a plurality of Layered and Surface Graphene Coated Electrodes, wherein creating materials timer and current amplification in the apparatus;

and further comprising components with a plurality of Anode Layered Graphene Coated Surface, wherein creating materials timer and current amplification in the apparatus;

and further comprising components with a plurality of Cathode Layered one or a combination of all materials including, Mg, Aluminum, Copper, or Zinc Coated Surface, wherein optimal electron flow can be created in the apparatus;

and still further comprising components with a plurality of Electrolyte, utilizing a combination of H20, Gel Polymer, Organic Seaweed, Chlorophyll, Diatomateous Earth, graphite and green plant leaves, where in electricity creation is optimized reducing environmental affects in the apparatus;

and further comprising functions with a Programmable Computer controlled Individual sensing and management of cells, wherein cells performance can be observed and optimized in the apparatus;

and further comprising connections to a plurality of programmable electronic mechanical electrode dipping switches, wherein electricity currents can be optimized in the apparatus;

and still further comprising connections to a plurality of super and ultra capacitors, wherein electricity currents can be optimized in the apparatus;

and further comprising connections to a plurality of USB Power User connectors, wherein electricity can be distributed to and from the apparatus;

and further comprising connections to a layered protection graphene grid encased in a polymer base, wherein electro magnetic pulse can be blocked, and storage can be additionally added patterned into the case of the apparatus;

and further comprising connections to an electricity recovery controller with a plurality of protection systems, wherein excess electricity can be generated, stored, and protected in the apparatus.

2. The components of claim 1 and further comprising Structural aspects, functions and processes for a power cell Switching System for the individual Shutoff of Cells, the Modifying Polarity and the Switching of Circuits from Parallel to Series Connection with these key functions;

The Function of a plurality of computer controlled switching devices in each cell that can Switch Between a plurality of Rechargeable Storage Devices Super capacitors, Ultra capacitors or batteries, wherein increasing or decreasing optimal voltage and current;

The function of a plurality of computer controlled switching devices in each cell that can Switch to Series or Parallel connections of Cells, wherein increasing or decreasing optimal voltage and current;

The function where each Switch has the apparatus wiring and logic of a computer controller that can change the Polarity+−Connection of Cell and Storage devices such as batteries to Series or Parallel connections, wherein increasing or decreasing optimal voltage and current;

The Function where each Switch can Switch Off or Override each cell in Connection and Storage devices such as batteries, wherein increasing or decreasing optimal voltage and current.

3. All aspects of claim 1 and further comprising component aspects, functions and processes of Electricity Generation and Energy Storage Capacitor Area with these key functions;

A component of a Plurality of + or − computer programmable polarity Cell Busbar Connection Circuits with wiring on each side of the cells controlled, and connected to switches, wherein increasing or decreasing optimal voltage and current;

The function structural aspect of computer programmable and controlled

Switchable Electricity Storage In each individual cell, wherein increasing or decreasing optimal voltage and current;

and further comprising a multiple cell configuration of;

high density graphene electrolyte gel polymer cells for greater electron storage in electron flow connected to one or a plurality of low density electrolyte gel polymer cells for increasing transferal speeds (voltage, current) in the cell.

4. All aspects of claim 1 and further comprising;

a Switching System for the individual Shutoff of Cells, wherein increasing or decreasing optimal voltage and current;

and further comprising component for providing a Modifying of Polarity and the Switching of Circuits from Parallel to Series Connection with these key functions and components, wherein increasing or decreasing optimal voltage and current;

and further comprising connections to a plurality of Software Controlled Switching apparatus, wherein increasing or decreasing optimal voltage and current;

and further comprising connections to an Anode, or plurality of Anodes, wherein increasing or decreasing optimal voltage and current;

and still further comprising component connections to an Electrolyte material consisting of one or more Wet/Dry/Gel electrolytes,/Dry polymer electrolyte,/Solid ceramic electrolyte,/Organic ionic plastic crystals, or $H_2O$ wherein increasing or decreasing optimal voltage and current;

and still even further comprising connections to a plurality of Electrical Storage devices, wherein for storage of electricity voltage and current;

and still even further comprising connections to a Cathode or plurality of Cathodes, wherein increasing or decreasing optimal voltage and current in the apparatus.

5. All aspects of claim 1 and further comprising Case of the Apparatus Assembly which includes Cathode and Anode Built into 3D Additive Printed and Manufactured Structure of the Booster Apparatus case and electrodes wherein reducing manufacturing costs, and increasing electricity storage;

and further comprising utilizing conductive 3D printing filament, wherein providing the manufacturing of conductive electronic components in the apparatus;

and further comprising utilizing non conductive 3D printing filament, wherein providing the manufacturing of non conductive electronic components in the apparatus.

6. All aspects of claim 1 and further comprising An EMP proof multi layered graphene protective Faraday Cage enclosure added by applying layers of a plurality of conductive graphene printed grids when the outer coating is applied on outside of case utilizing over molding with injection molding and a 3D Printing additive process for a patterned Graphene grid that creates a Faraday cage built into the case for protection from (EMP) Electro Magnetic Pulse damage;

and further comprising an energy creation electronic switching circuit from case Faraday caged grid connected to super capacitors so that the electrical energy created by an EMP can be stored or dispersed to the system for use.

7. All aspects of claim 1 and further comprising utilization of energy storage with computer programmable electronic and mechanical switching between Super and Ultra Capacitors combined with Batteries for dependable appliance energy use as a core component of the apparatus;

and further comprising an additional component of the apparatus where a magnesium layered cathode protects a graphene layered anode, and multiple magnesium cathodes are sacrificed and switched on or off utilizing electronic, mechanical and different layered coating materials to extend the lifespan of the cell energy generation.

8. All aspects of claim 1 and further comprising a DC Wall Adaptor, and apparatus for appliances with the following components and functions;

A plurality of USB-C PD Aware Power Delivery wall jacks that are able to pull +12 v from a USB power source that is programmable assuming the device is telling the power source that it is ready to receive the +12 v, wherein electricity can be distributed;

An Alternative Energy Booster Apparatus and other DC Electricity Sources for 12 volt or higher DC Electricity transferal to USB-C PDAware Wall Adaptor apparatus with following components and functions, wherein electricity can be distributed;

comprising a Wall plate with USB-C PD Aware Plugin Sockets;

further comprising an Apparatus and Functions for USB-C PDAware Direct DC Appliance Use, wherein electricity can be distributed;

further comprising an Apparatus for use with DC Electricity Generation Apparatus, Solar Panel, Battery, and other Generation and Storage Devices, wherein electricity can be distributed;

further comprising an Apparatus Connected Directly or indirectly through controller to USB-C PDAware Wall Plate, wherein electricity can be distributed;

and further comprising a Wireless electricity transferal system utilizing a plurality of electronic low energy laser array transmitters, wherein electricity can be transmitted to be distributed;

and further comprising a Wireless electricity transferal system utilizing a plurality of electronic solar panel photo voltaic receivers, wherein electricity can be received to be distributed.

9. All aspects of claim 1 and further comprising a plurality of layered electrode manufacturing of energy cell timer electrodes, utilizing a process and apparatus using a Teflon mold for making non stick layers of Graphene and Aqueous Gel Acrylic Polymer;

for the purpose of increasing the lifespan of the Anode electrode, and Cathode Electrode in the disclosed apparatus;

and still further including a Microscopic Leaf Wetness apparatus layered coating as a separation layer of the cell apparatus;

and still further comprising the including of a plurality of graphene layers added to outside surface, above aqueous layers on the metal electrodes creating distinct water adhesion attributed to the different Van der Waals attraction on the surface nano structure for protected conduction;

and still further including where a vertical graphene micro sheet surface layered coating provides the line contact with a smaller contact area resulting in the low adhesive force where tilted micro sheets created by a one direction buffing during manufacturing offers a larger contact area which dramatically increases the water adhesive force, while reducing corrosion activity, and increasing the lifespan of the electrode in the cells of the apparatus;

and still further comprising a plurality of metal cells electrodes coated to create Dipole-dipole positive to negative attraction forces for the purpose of reducing corrosion, and increasing electricity generation in the presented apparatus.

10. All aspects of claim 1 and further comprising water proof case apparatus for under water applications, drones, and for vehicles;

and further comprising an additional component of the apparatus where a magnesium layered cathode protects a graphene layered anode, and multiple magnesium cathodes are sacrificed and switched on or off utilizing electronic, mechanical and special coating materials to extend the lifespan of the energy cell generation in aqueous cell conditions.

11. All aspects of claim 1 and further comprising apparatus having a plurality of energy cells inside one energy cell container, wherein additional electric voltage and current can be generated in the apparatus;

and further comprising utilizing water flowing over a plurality of graphene and magnesium mini electrodes producing energy creation through tubing, wherein additional electric voltage and current can be generated in the apparatus;

and further comprising utilizing water flowing over a plurality of graphene and magnesium mini electrodes producing energy creation through flat panels, wherein additional electric voltage and current can be generated in the apparatus;

and further comprising utilizing water flowing over a plurality of graphene and magnesium mini electrodes producing energy creation through solar heated tubes, wherein additional electric voltage and current can be generated in the apparatus;

and further comprising the cell apparatus combined with a plurality of electronically controlled Peltier devices built into the apparatus case structure creating electricity from the differential cold and hot of cool or hot water, and exterior cool or hot air, wherein additional electric voltage and current can be generated in the apparatus.

12. All aspects of claim 1 and further comprising infrared energy creation apparatus connected to each cell, wherein additional electric voltage and current can be generated in the apparatus;

comprising a Peltier hot cold generation of DC electricity, wherein additional electric voltage and current can be generated in the apparatus;

and further comprising a plurality of magnetic DC motors used as generators powered by single DC motor to create DC current, wherein additional electric voltage and current can be generated in the apparatus;

and still further comprising a plurality of magnetic AC induction motors used as generators powered by a single DC motor to create AC current, wherein additional electric voltage and current can be generated in the apparatus.

13. All aspects of claim 1 and further comprising an apparatus built into the cell where the anode, and cathode is created by adding a plurality of 3D additive printed acrylic timer layers of conductive materials for the purpose of:

assembled layered materials delaying corrosion;

implementing a plurality of sacrificial anodes or cathodes;

layered timer coatings apparatus increasing the lifespan of the cell dramatically;

utilizing a plurality of layers resulting in the function of the apparatus to time when the cell will reduce it's potential energy and stop working;

and further utilizes coatings, thickness of coatings, and conductivity of coatings to mechanically program the timing of when a cell stops working as a switch, wherein additional electric voltage and current can be generated in the apparatus.

14. All aspects of claim 1 and further comprising an aqueous gel electrolyte included and used as a component in the apparatus with differing conductivities, and energy densities in a plurality of cells comprised of these materials added to the apparatus aqueous gel electrolyte;

H2O, Water;

Vegetable Glycerin;

Aloe Vera Extract;

Carbomer;

Polyacrylate Acid;

Phenylcarbinol;

Triethanolamine;

Methylchloisothiazolinone;

Methylisotiazolinone;

Panthenol (from plants);

and further comprising the previous combined chemicals wherein providing additional optimal electric voltage and current to be generated in the apparatus;

and still further comprising as a component in the apparatus the above listed materials in a plurality of different cells including and comprised of these additional materials added to the apparatus aqueous gel electrolyte;

Graphene;

Graphite;

wherein additional electric voltage and current can be generated in the apparatus;

and still further comprising the above listed materials in a plurality of different cells including and comprised of these additional materials added to the apparatus aqueous gel electrolyte;

Diatomateous Earth blended with a 50% mixture of Graphene;

and still further comprising the above listed materials in a plurality of different cells including and comprised of these additional materials added to the apparatus aqueous gel electrolyte;

Chlorophyll;

Plant Cellulose;

wherein additional electric voltage and current can be generated in the apparatus.

15. All aspects of claim 1 and further comprising an apparatus where a single or plurality of cathodes can be programmed to electronically mechanically be replaced, wherein securing the continuity of electricity generation and storage in the apparatus;

comprising programmable use in or outside of a payment platform as a self contained remote control component connected to mobile phone or remote wired or wireless device to manage payments, and remotely repair the presented apparatus, wherein securing the continuity of electricity generation and storage in the apparatus;

further comprising the use in a refurbishment system to extend the time of use in the presented apparatus, wherein securing the continuity of electricity generation and storage in the apparatus;

further comprising the use in increasing energy creation to create more power output in the presented apparatus;

further comprising the use in increasing voltage or current transferal in the presented apparatus.

16. All aspects of claim 1 and further comprising an apparatus where a single or plurality of anodes can be programmed to electronically mechanically be replaced, wherein securing the continuity of electricity generation and storage in the apparatus;

comprising programmable use in or outside of a payment platform as a self contained remote control component connected to mobile phone or remote wired or wireless device to manage payments, and remotely repair the presented apparatus, wherein securing the continuity of electricity generation and storage in the apparatus;

further comprising the use in a refurbishment system to extend the time of use in the presented apparatus, wherein securing the continuity of electricity generation and storage in the apparatus;

further comprising the use in increasing energy creation to create more power output in the presented apparatus;

further comprising the use in increasing voltage or current transferal in the presented apparatus.

17. All aspects of claim 1 and further comprising an apparatus where a single or plurality of electrolytes can be programmed to electronically mechanically be replaced, wherein securing the continuity of electricity generation and storage in the apparatus;

comprising programmable use in or outside of a payment platform as a self contained remote control component connected to mobile phone or remote wired or wireless device to manage payments, and remotely repair the presented apparatus, wherein securing the continuity of electricity generation and storage in the apparatus;

further comprising the use in a refurbishment system to extend the time of use in the presented apparatus, wherein securing the continuity of electricity generation and storage in the apparatus;

further comprising the use in increasing energy creation to create more power output in the presented apparatus;

further comprising the use in increasing voltage or current transferal in the presented apparatus.

18. All aspects of claim 1 and further comprising an apparatus where a single or plurality of the anodes, cathodes and electrolytes can be programmed to electronically mechanically be disabled, wherein securing the continuity or discontinuity of electricity generation and storage in the apparatus;

temporarily;

permanently;

for a date and time;

or for a programmed period of time;

managed by a programmable controller as a mechanical switching system;

comprising programmable use in or outside of a payment platform as a self contained remote control component connected to mobile phone or remote wired or wireless device to manage payments, and remotely repair the presented apparatus, wherein securing the continuity of electricity generation and storage in the apparatus;

further comprising the use in a refurbishment system to extend the time of use in the presented apparatus, wherein securing the continuity of electricity generation and storage in the apparatus;

further comprising the use in increasing energy creation to create more power output in the presented apparatus;

further comprising the use in increasing voltage or current transferal in the presented apparatus.

19. All aspects of claim 1 and further comprising an apparatus where a plurality of electrodes are dipped into and out of an electrolyte electronically timed and dipping depth managed by a programmable controller as an electronically controlled mechanical switching system for the purpose of;

lengthening the life cycle of the electrode;

increasing the electrical potential;

increasing the electrolyte life cycle;

comprising programmable use in or outside of a payment platform as a self contained remote control component connected to mobile phone or remote wired or wireless device to manage payments, and remotely repair the presented apparatus;

further comprising the use in a refurbishment system to extend the time of use in the presented apparatus;

further comprising the use in increasing energy creation to create more power output in the presented apparatus;

further comprising the use in increasing voltage or current transferal in the presented apparatus.

20. All aspects of claim 1 and further comprising an apparatus where single or a plurality of anodes, cathodes, electrolytes, and case enclosures can be used as active programmed security and payment components, wherein securing the continuity or discontinuity of electricity generation and storage in the apparatus;

comprising an electronic electricity recovery controller, wherein additional electric voltage and current can be generated in the apparatus;

further comprising a plurality of tamper proof protection systems, wherein securing the continuity or discontinuity of electricity generation and storage in the apparatus;

further comprising user programmable security attached to a block chain, wherein securing the continuity or discontinuity of electricity generation and storage in the apparatus;

further comprising a management controller remotely wired or wireless from a mobile device, phone, drone or laser light device, wherein securing the continuity or discontinuity of electricity generation and storage in the apparatus;

and still further comprising a plurality of 3D additive printed layers of conductive materials that can be programmed as a hard wired integrated circuit by the way the layers are printed to be switched on or off electronically individually utilizing a block chain encryption in or outside a payment security system switch in the presented apparatus, wherein securing the continuity or discontinuity of electricity generation and storage in the apparatus.

\* \* \* \* \*